(12) United States Patent
Nakagawa et al.

(10) Patent No.: US 10,541,216 B2
(45) Date of Patent: Jan. 21, 2020

(54) SEMICONDUCTOR DEVICE

(71) Applicant: RENESAS ELECTRONICS CORPORATION, Tokyo (JP)

(72) Inventors: Kazuyuki Nakagawa, Tokyo (JP); Keita Tsuchiya, Tokyo (JP); Yoshiaki Sato, Tokyo (JP); Shuuichi Kariyazaki, Tokyo (JP); Norio Chujo, Tokyo (JP); Masayoshi Yagyu, Tokyo (JP); Yutaka Uematsu, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/175,522

(22) Filed: Oct. 30, 2018

(65) Prior Publication Data

US 2019/0198462 A1    Jun. 27, 2019

(30) Foreign Application Priority Data

Dec. 21, 2017    (JP) .................................. 2017-245158

(51) Int. Cl.
*H01L 27/146* (2006.01)
*H01L 23/66* (2006.01)
(Continued)

(52) U.S. Cl.
CPC .......... *H01L 23/66* (2013.01); *H01L 23/3675* (2013.01); *H01L 23/5383* (2013.01);
(Continued)

(58) Field of Classification Search
CPC ..... H01L 23/48; H01L 23/488; H01L 23/492; H01L 23/49534; H01L 23/52;
(Continued)

(56) References Cited

U.S. PATENT DOCUMENTS

| 6,747,356 B2 | 6/2004 | Ando et al. |
| 2017/0287852 A1* | 10/2017 | Jeon ..................... H01L 23/3121 |
| 2018/0197801 A1* | 7/2018 | Naruse ..................... H01L 23/12 |

FOREIGN PATENT DOCUMENTS

| JP | 2003-273273 A | 9/2003 |
| JP | 2008-311682 A | 12/2008 |

(Continued)

*Primary Examiner* — Jae Lee
(74) *Attorney, Agent, or Firm* — McDermott Will & Emery LLP

(57) ABSTRACT

A semiconductor device includes a semiconductor chip mounted over a wiring substrate. A signal wiring for input for transmitting input signals to the semiconductor chip and a signal wiring for output for transmitting output signals from the semiconductor chip are placed in different wiring layers in the wiring substrate and overlap with each other. In the direction of thickness of the wiring substrate, each of the signal wirings is sandwiched between conductor planes supplied with reference potential. In the front surface of the semiconductor chip, a signal electrode for input and a signal electrode for output are disposed in different rows. In cases where the signal wiring for output is located in a layer higher than the signal wiring for input in the wiring substrate, the signal electrode for output is placed in a row closer to the outer edge of the front surface than the signal electrode for input.

19 Claims, 19 Drawing Sheets

(51) Int. Cl.
*H01L 23/538* (2006.01)
*H01L 23/367* (2006.01)
*H01L 23/00* (2006.01)

(52) U.S. Cl.
CPC .......... *H01L 23/5386* (2013.01); *H01L 24/16* (2013.01); *H01L 2223/6616* (2013.01); *H01L 2223/6638* (2013.01); *H01L 2224/16227* (2013.01); *H01L 2924/19041* (2013.01); *H01L 2924/19105* (2013.01)

(58) Field of Classification Search
CPC ............... H01L 23/522; H01L 23/5385; H01L 23/5386; H01L 25/167; H01L 27/146; H01L 27/14601; H01L 27/14625; H01L 27/14636
See application file for complete search history.

(56) References Cited

FOREIGN PATENT DOCUMENTS

| | | | |
|---|---|---|---|
| JP | 2009-004809 A | 1/2009 | |
| JP | 2013-239511 A | 11/2013 | |

\* cited by examiner

SEMICONDUCTOR DEVICE

CROSS-REFERENCE TO RELATED APPLICATIONS

The disclosure of Japanese Patent Application No.2017-245158 filed on Dec. 21, 2017 including the specification, drawings and abstract is incorporated herein by reference in its entirety.

BACKGROUND

The present invention relates to a semi conductor device and a technology effectively applicable to, for example, a semiconductor device provided with a circuit for transmitting signals at high speed.

Patent Document 1 (Japanese Unexamined Patent Application Publication No. 2003-273273) describes a semiconductor device in which a characteristic impedance is adjusted by a thickness of an insulating layer located between a wiring for transmitting signals and a plane layer.

Patent Document 2 (Japanese Unexamined Patent Application Publication No. 2008-311682) and Patent Document 3 (Japanese Unexamined Patent Application Publication No. 2009-4809) describe a structure in which a plurality of through conductors supplied with ground potential are arranged around a through conductor coupled to a wiring for transmitting differential signals.

Patent Document 4 (Japanese Unexamined Patent Application Publication No. 2013-239511) describes a structure of a wiring board in which a plurality of dielectric layers different in dielectric loss tangent are disposed between ground layers opposed to each other with a wiring for transmitting differential signals in between.

PATENT DOCUMENT

[Patent Document 1] Japanese Unexamined Patent Application Publication No. 2003-273273
[Patent Document 2] Japanese Unexamined Patent Application Publication No. 2008-311682
[Patent Document 3] Japanese Unexamined Patent Application Publication No. 2009-4809
[Patent Document 4] Japanese Unexamined Patent Application Publication No. 2013-239511

SUMMARY

The present inventors have been involved in engineering development for enhancing the performance of a semiconductor device. As a part of the activities, the present inventors are addressing the enhancement of transmission speed of signals inputted to a semiconductor chip mounted over a wiring substrate or signals outputted from such a semiconductor chip. For example, the present inventors investigated antinoise measures for a high-speed transmission path transmitting signals at high speed and found that there was room for improvement.

For example, to provide a large number of high-speed transmission paths while suppressing increase in size of a semiconductor device, arranging intervals between electrodes provided in a semiconductor chip become reduced. As a result, a large number of signal transmission paths are disposed at a high density in proximity to an input terminal or output terminal of the semiconductor chip. In this case, there is need for a technology for reducing mutual influence of respective noise between the signal transmission paths.

Other problems and novel features will be apparent from the description of the present specification and the accompanying drawings.

SUMMARY

A semiconductor device according to an embodiment includes a semiconductor chip mounted over a wiring substrate. A signal wiring for input transmitting input signals to the semiconductor chip and a signal wiring for output transmitting output signals from the semiconductor chip are disposed in different wiring layers in the wiring substrate and, at the same time, overlap with each other. In the direction of the thickness of the wiring substrate, each of the signal wiring for input and the signal wiring for output is sandwiched between conductor patterns supplied with fixed potential. In the surface of the semiconductor chip, a signal electrode for input and a signal electrode for output are arranged in different rows. When the signal wiring for output is located in a layer higher than the signal wiring for input in the wiring substrate, the signal electrode for output is arranged in a row closer to the outer edge of the surface than the signal electrode for input is.

According to the above embodiment, performance of the semiconductor device can be enhanced.

Figure 1:
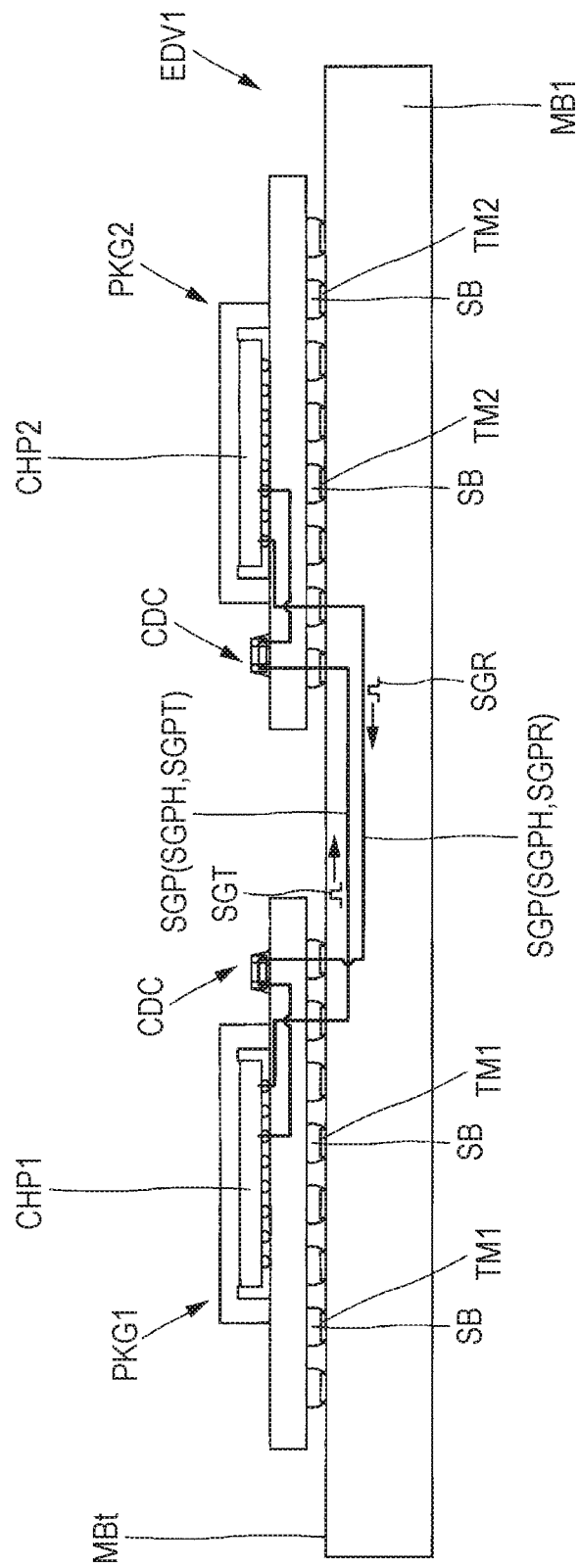
FIG. 1 is an explanatory drawing illustrating an example configuration of an electronic device.

DETAILED DESCRIPTION (Style of Description, Basic Terms, and Usage Thereof in the Present Specification)

The description of embodiments in the present specification is divided into multiple sections or the like as required for the sake of convenience. These sections or the like are not independent of or separate from one another unless otherwise explicitly stated. Each section or the like is each part of a single example and one section is the details of part of another or a modification or the like to part or all of another regardless of the order of description. The repetitive description of a similar part will be omitted as a rule. Each constituent element of the embodiments is not indispensable unless otherwise explicitly stated, the number of constituent elements is theoretically limited, or the constituent element is contextually obviously indispensable.

Similarly, even when the wording of "X comprised of A" or the like is used in the description of the embodiments with respect to material, composition, or the like, what containing an element other than A as one of major constituent elements is not excluded. This applies unless otherwise explicitly stated or it is contextually obviously excluded. Examples will be taken. With respect to component, the above wording means that "X including A as a main component" or the like. A term of "silicon member" or the like is not limited to members of pure silicon and includes SiGe (silicon germanium) alloys, other multi-element alloys predominantly composed of silicon, and members containing other additive or the like, needless to add. The terms of gold plate, copper layer, nickel plate, and the like include not only pure ones but also members respectively predominantly composed of gold, copper, nickel, and the like unless otherwise explicitly stated.

When reference is made to any specific numeric value or quantity, the specific numeric value or quantity may be exceeded or may be underrun. This applies unless otherwise explicitly stated, any other specific numeric value or quantity is theoretically impermissible, or the specific numeric value or quantity contextually may not be exceeded or underrun.

In each drawing illustrating the following embodiments, an identical or similar part will be marked with an identical or similar reference numeral and a repetitive description thereof will be omitted as a rule.

In each accompanying drawing, hatching or the like may be omitted even though the drawing is a sectional view when the hatching or the like complicates the drawing or the section can be easily discriminated from a hollow. In relation to this, even for a planarly closed hole, an outline on the background may be omitted in cases where the hole is obvious from a description or the like or other like cases. Even when a part is not a section, the part may be hatched or affixed with a dot pattern for making it clear that the part is not a hollow or clearly indicating a border between areas.

Electronic Device

First, a description will be given to an example configuration of an electronic device in which a plurality of semiconductor devices (semiconductor packages) are mounted over a mother board and electrical signals are transmitted between the semiconductor devices with reference to FIG. 1 and FIG. 2. FIG. 1 is an explanatory drawing illustrating an example configuration of an electronic device including a semiconductor device in an embodiment.

Figure 2:
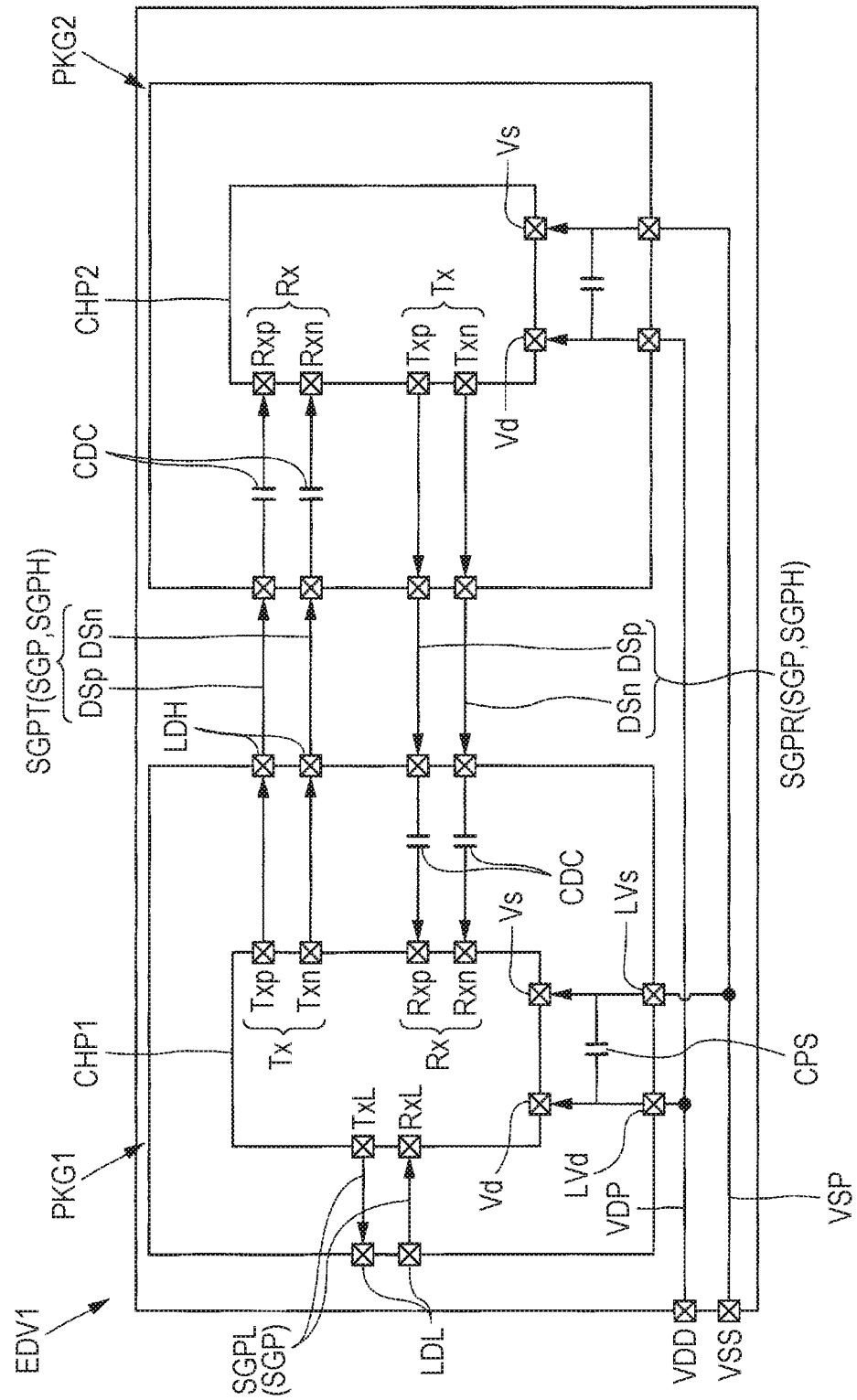
FIG. 2 is an explanatory drawing illustrating an example configuration of circuitry provided in the electronic device shown in FIG. 1.

FIG. 2 is an explanatory drawing illustrating an example configuration of circuitry provided in the electronic device shown in FIG. 1. In FIG. 1, a high-speed transmission path SGPH shown in FIG. 2 is schematically indicated by a bold line for explicitly indicating that a semiconductor device PKG1 and a semiconductor device PKG2 are electrically coupled with each other.

The electronic device (electronic equipment) EDV1 shown in FIG. 1 includes a circuit board (mother board, mount board) MB1 and the semiconductor device PKG1 and the semiconductor device PKG2 mounted over the circuit board MB1. The semiconductor device PKG1 and the semiconductor device PKG2 are electrically coupled with each other via signal transmission paths SGP formed in the circuit board MB1. Signals transmitted via the signal transmission paths SGP include signals SGT outputted from the semiconductor device PKG1 and signals SGR inputted to the semiconductor device PKG1. The signal transmission paths SGP include a signal transmission path SGPT transmitting signals SGT and a signal transmission path SGPR transmitting signals SGR.

In the example shown in FIG. 1, signals SGT are outputted from the semiconductor device PKG1 and inputted to the semiconductor device PKG2. Signals SGR are outputted from the semiconductor device PKG2 and inputted to the semiconductor device PKG1. However, a destination to which signals SGT are outputted or a source from which signals SGR are outputted is not limited to the example shown in FIG. 1 and there are various modifications. Since the semiconductor device PKG1 and semiconductor device PKG2 shown in FIG. 1 have a similar structure and in the following description, the semiconductor device PKG1 will be taken as a representative example.

As illustrated in FIG. 2, the electronic device EDV1 includes a plurality of signal transmission paths SGP. In the example shown in FIG. 2, the signal transmission paths SGP coupled to the semiconductor device PKG1 include: a low-speed transmission path (low-speed signal transmission path) SGPL transmitting electrical signals at a first transmission speed; and a high-speed transmission path (high-speed signal transmission path) SGPH transmitting electrical signals at a second transmission speed higher than the first transmission speed. In the example shown in FIG. 2, the high-speed transmission path SGPH is comprised of a pair of differential signal transmission paths DSp, DSn transmitting differential signals.

In the description of the present embodiment, an implementation in which differential signals are transmitted via a pair of the differential signal transmission paths DSp, DSn is taken as an example of the high-speed transmission path SGPH. Aside from differential signals, various modifications are applicable in terms of the type of high-speed signals. For example, even in case of a so-called single-end structure in which a single signal transmission path SGP is used, high-speed transmission can be implemented by increasing a frequency.

As illustrated in FIG. 2, the semiconductor chip CHP1 provided in the semiconductor device PKG1 includes a plurality of electrodes. The electrodes provided in the semiconductor chip CHP1 include signal electrodes Tx (specifically, a signal electrode Txp and a signal electrode Txn from which a pair of differential signals are transmitted) from which signals SGT (Refer to FIG. 1) as output signals (transmit signals) are transmitted. The electrodes provided in the semiconductor chip CHP1 include signal electrodes Rx (specifically, a signal electrode Rxp and a signal electrode Rxn to which a pair of differential signals are inputted)

to which signals SGR (Refer to FIG. 1) as input signals (receive signals) are transmitted. Further, in the example shown in FIG. 2, the electrodes provided in the semiconductor chip CHP1 include a signal electrode (low-speed signal electrode) TxL and a signal electrode (low-speed signal electrode) RxL coupled to the low-speed transmission paths SGPL.

In addition, the electrodes provided in the semiconductor chip CHP1 include: a power supply potential electrode Vd supplied with power supply potential VDD; and a reference potential electrode Vs supplied with reference potential VSS. The semiconductor chip CHP1 (specifically, the circuitry provided in the semiconductor chip CHP1) is supplied with power supply potential VDD via the power supply potential electrode Vd. The semiconductor chip CHP1 (specifically, the circuit provided in the semiconductor chip CHP1) is supplied with reference potential VSS via the reference potential electrode Vs. At least some of a plurality of the circuits provided in the semiconductor chip CHP1 are driven by drive voltage generated by a potential difference between power supply potential VDD and reference potential VSS. The reference potential VSS is, for example, ground potential and the power supply potential VDD is higher than the reference potential VSS.

The electronic device EDV1 has a capacitor CPS for power supply circuit inserted into a power supply circuit by parallel coupling. The capacitor CPS shown in FIG. 2 is inserted in between a reference potential supply path VSP for supplying reference potential VSS to the semiconductor chip CHP1 and a power supply potential supply path VDP for supplying power supply potential VDD to the semiconductor chip CHP1. The capacitor CPS can be caused to function as a bypass capacitor that diverts noise (signal) included in the power supply potential supply path VDP to the reference potential supply path VSP side and lets it through. The capacitor CPS can be caused to function as a decoupling capacitor that reduces a loop (passage distance) of a current passed through the circuitry formed in the semiconductor chip CHP1 and thereby reduces an influence of an impedance component included in the power supply potential supply path VDP and the reference potential supply path VSP. When coupled in proximity to a circuit consuming supplied power, the capacitor CPS can be caused to function as a battery that suppresses a phenomenon of drive voltage instantaneously dropping.

Each of the above-mentioned bypass capacitor, decoupling capacitor, and capacitor CPS for power supply circuit used as a battery is inserted into the power supply circuit by parallel coupling. Meanwhile, a capacitor CDC is inserted into a signal transmission path SGP by series coupling. For this reason, when the high-speed transmission paths SGPH are comprised of the differential signal transmission paths DSp, DSn as shown in FIG. 2, the capacitor CDC is inserted into each of the differential signal transmission path DSp and the differential signal transmission path DSn.

When signals are transmitted at high speed as in the electronic device EDV1, it is desirable to couple the capacitors CDC in series in the high-speed transmission paths SGPH. A direct-current component contained in an alternating-current signal can be cut by the capacitors CDC inserted into the high-speed transmission paths SGPH. As a result, signal input/output at high speed can be stabilized. The capacitor CDC that is inserted into a signal transmission path by series coupling and cuts a direct-current component contained in an alternating-current signal is referred to as capacitor for DC (Direct Current) cut or capacitor for AC (Alternate Current) coupling (hereafter, referred to as capacitor for DC cut).

At least one or more capacitors CDC as capacitor for DC cut only have to be inserted into the high-speed transmission paths SGPH. Therefore, as a modification to the present embodiment, the capacitor CDC may also be provided in the circuit board MB1 shown in FIG. 1. In this case, the capacitor CDC may be not provided in the semiconductor device PKG1 or the semiconductor device PKG2.

However, when the capacitor CDC is incorporated into the semiconductor device PKG1 as shown in FIG. 2, a layout of wiring formed in the circuit board MB1 can be simplified. As a result, the circuit board MB1 can be reduced in size.

In the low-speed transmission paths SGPL shown in FIG. 2, electrical signals are transmitted at a transmission speed of, for example, less than 3 Gbps (Gigabits per second). In a high-speed transmission path SGPH formed by electrically coupling a signal electrode Tx and a signal electrode Rx with each other, electrical signals are transmitted at a transmission speed of, for example, approximately 10 Gbps to 60 Gbps. The high-speed transmission paths SGPH are required to meet high-level requirements in terms of transmission loss reduction, crosstalk noise reduction, and the like. Especially, to accommodate a transmission speed higher than 50 Gbps, requirement levels with respect to transmission loss reduction, crosstalk noise reduction, and the like are very high because of, for example, a coding scheme for electrical signals.

An example of schemes for line code utilized to transmit electrical signals is a scheme called NRZ (Non Return to Zero). In the NRZ scheme, one bit is expressed by two states (for example, positive voltage level and zero-volt voltage level) of signal pulses. In case of the NRZ scheme, signal transmission is accelerated by increasing a frequency of a pulse signal. In conjunction with increase in frequency of a pulse signal, requirement levels are raised in terms of transmission loss reduction, crosstalk noise reduction, and the like.

One of methods for increasing a signal data rate (data transfer rate) is a modulation scheme called PAM (Pulse Amplitude Modulation). In PAM, the amplitude of signal waveform is classified into a plurality of types on a symbol by symbol basis. In case of PAM4, for example, the signal waveform is classified into four types of amplitude levels (hereafter, referred to as 4 level Pulse-Amplitude Modulation (PAM4)). In case of PAM4, four bits can be expressed by one cycle; therefore, even if a signal transmission speed is identical, a data rate can be increased. In cases where a ½-frequency is taken as a Nyquist frequency, the following takes place: for example, when signals are transmitted at a data rate of 56 Gbps utilizing the NRZ scheme, 28 GHz is obtained, whereas when signals are transmitted at a data rate of 56 Gbps utilizing PAM4, 14 GHz is obtained. For this reason, at an identical data rate, transmission loss can be reduced by utilizing PAM4.

In case of PAM4, however, it is necessary to clarify an eye pattern aperture (eye aperture) corresponding to 4 level Pulse-Amplitude Modulation (PAM4). An eye aperture corresponding to 4 level Pulse-Amplitude Modulation (PAM4) is narrower in amplitude than an eye aperture corresponding to binary; therefore, enhancement of waveform quality is more important. For this reason, requirement levels become stricter than in the case of the NRZ scheme in terms of crosstalk noise reduction, jitter, and the like. For example, when signals are transmitted at a data rate of 56 Gbps utilizing PAM4, crosstalk in a high-speed transmission path SGPH must be suppressed to 1/10 or less as compared with cases where signals are transmitted at a data rate of 12.5 Gbps utilizing the NRZ scheme. As mentioned above, in the case of PAM4, transmission loss can be reduced as compared with the NRZ scheme. However, as compared with cases where signals are transmitted, for example, at a data rate of 12.5 Gbps, transmission loss reduction is required. One of methods for crosstalk reduction is to place a conductor pattern supplied with ground potential between high-speed transmission paths SGPH adjoining to each other. However, when signals are transmitted at 56 Gbps utilizing PAM4, it is necessary to increase an area of a conductor pattern of electrodes and the like configuring the high-speed transmission paths SGPH to approximately 1.5 times as compared with cases where signals are transmitted at 12.5 Gbps utilizing the NRZ scheme.

Consequently, as a part of an effort to reduce transmission loss or crosstalk noise for enhancement of the reliability of high-speed signal transmission paths, the present inventors investigated a structure of signal transmission paths in the semiconductor device PKG1 and found the technology described blow.

Semiconductor Device

Figure 3:
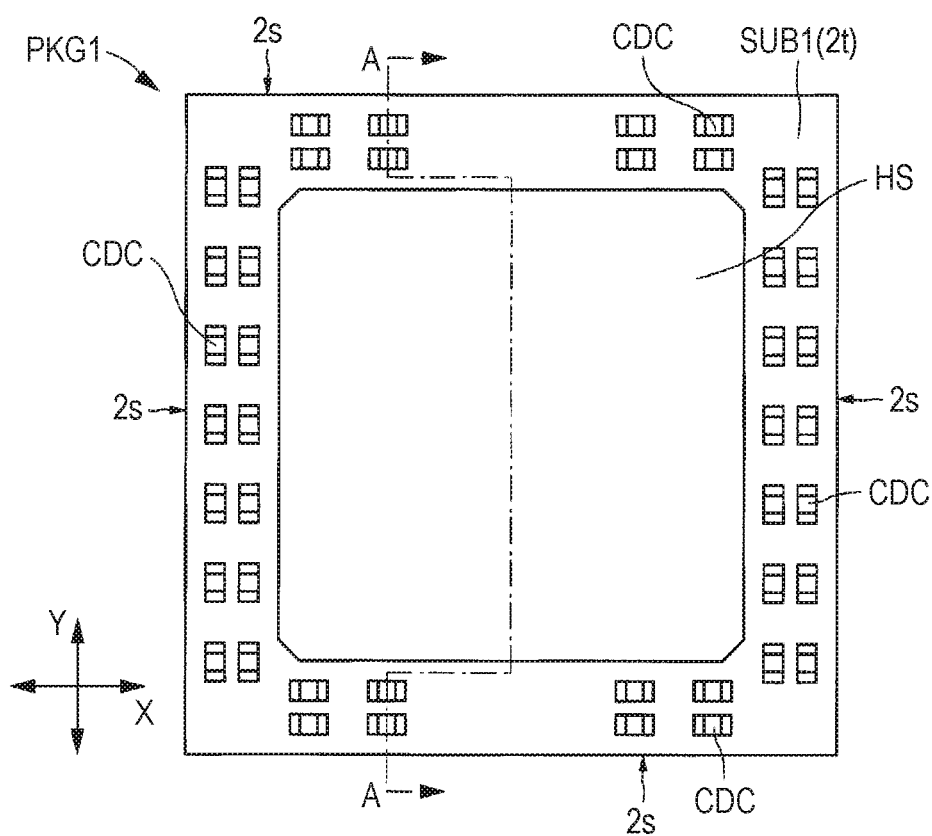
FIG. 3 is atop view of one semiconductor device of the two semiconductor devices shown in FIG. 1.
Figure 4:
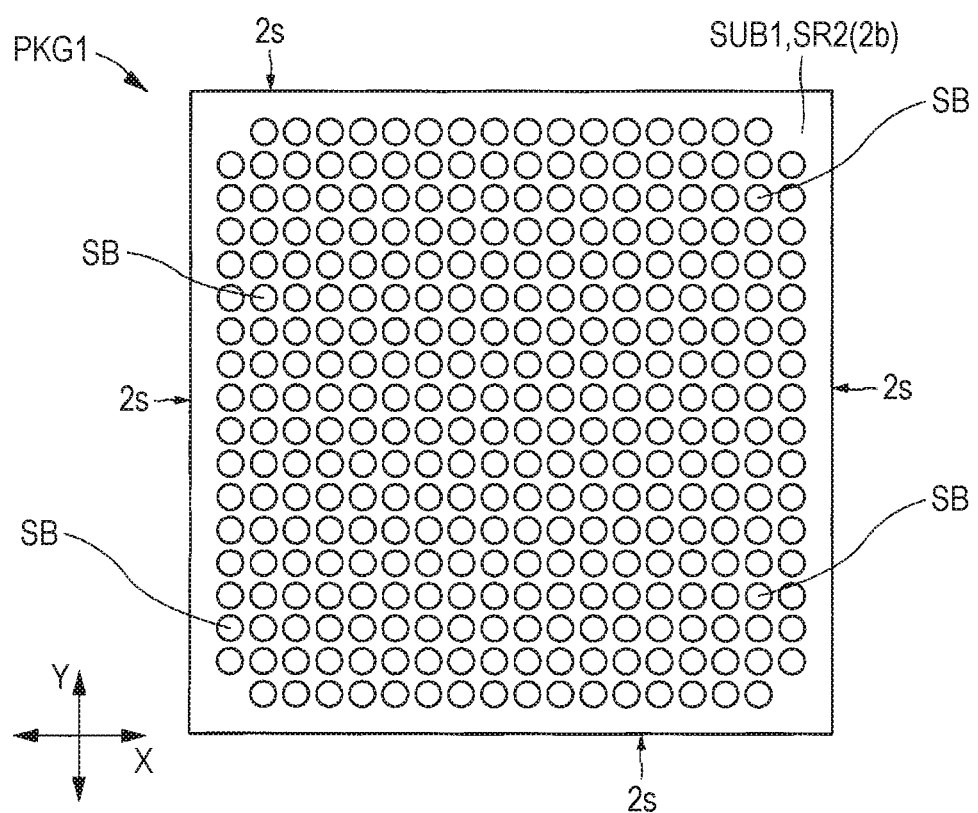
FIG. 4 is a bottom view of the semiconductor device shown in FIG. 3.
Figure 5:
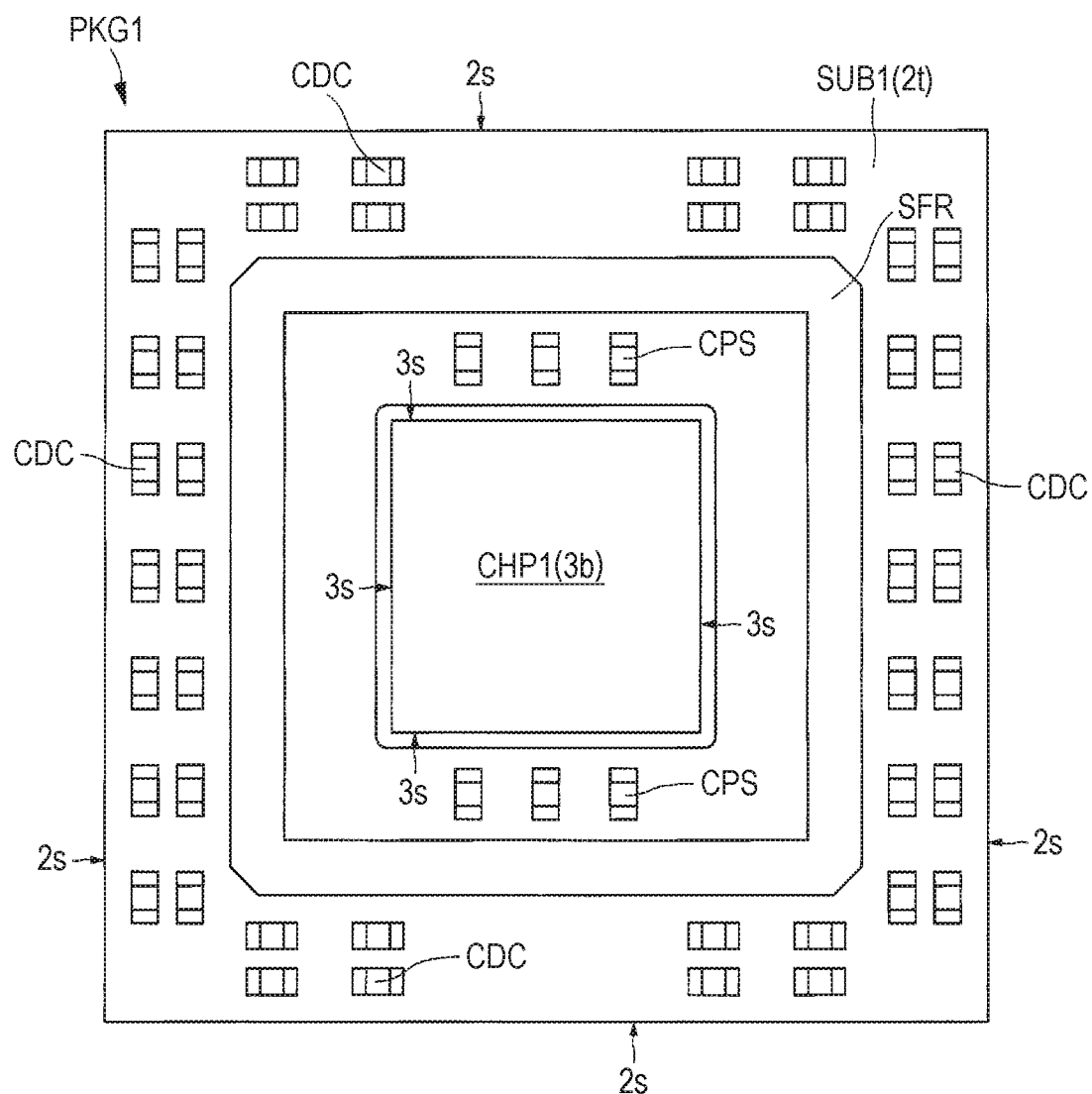
FIG. 5 is a plan view illustrating an internal structure of the semiconductor device over a wiring substrate with the heat sink shown in FIG. 3 removed.
Figure 6:
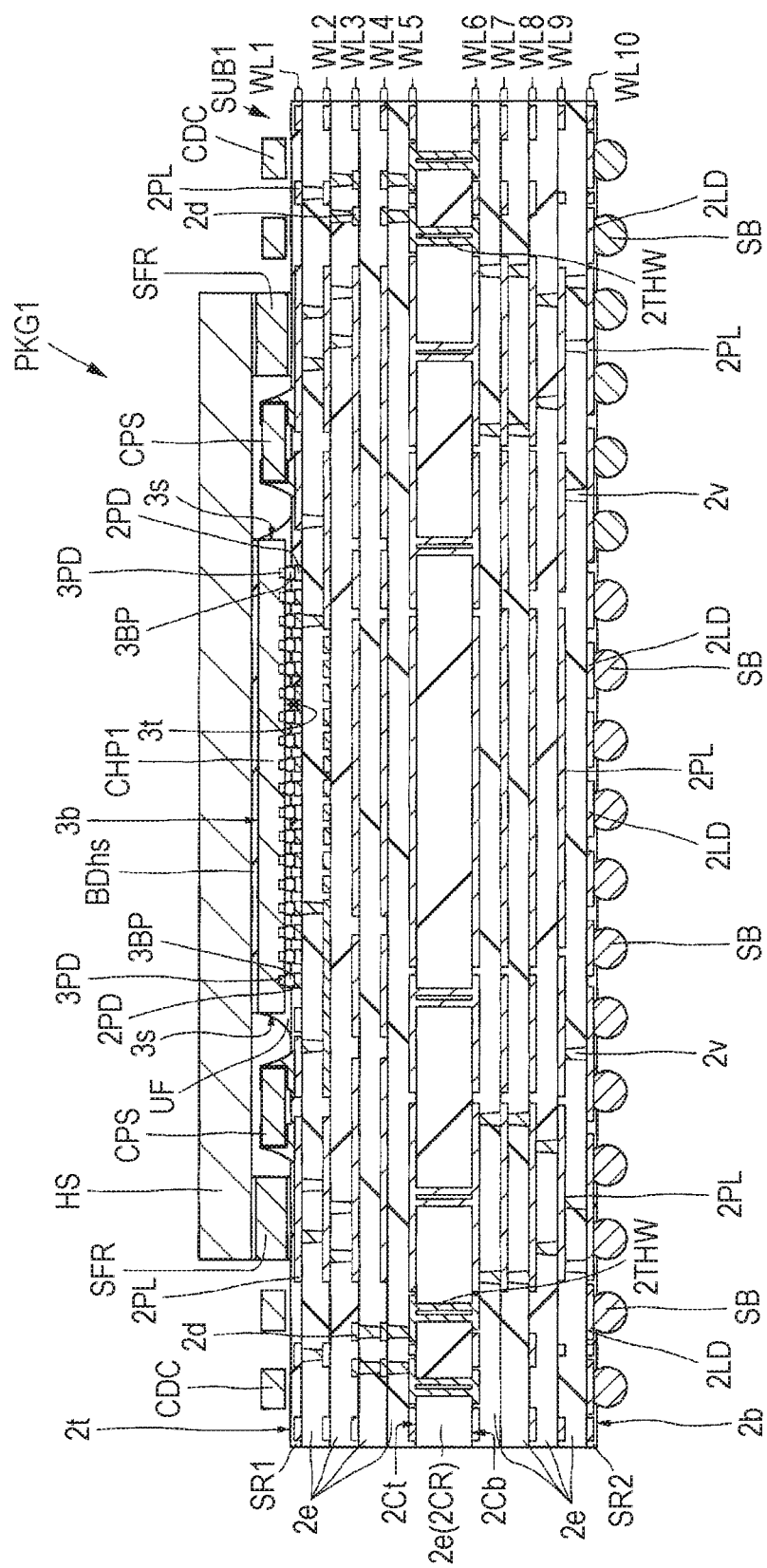
FIG. 6 is a sectional view taken along line A-A of FIG. 3.
Figure 7:
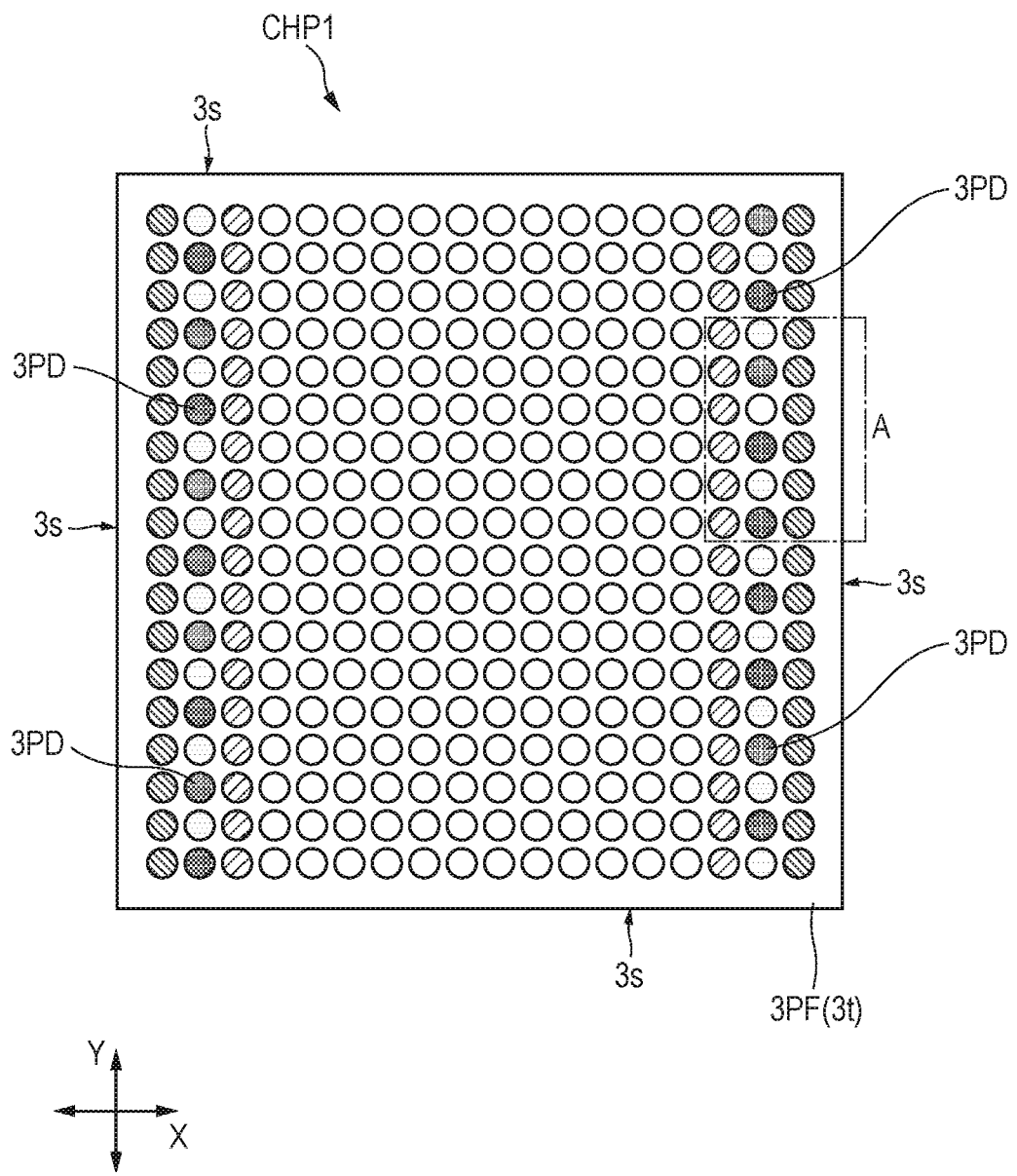
FIG. 7 is a plan view of an electrode placement surface of the semiconductor chip shown in FIG. 6.

The semiconductor device PKG1 shown FIG. 1 will be taken as an example and a description will be given to an example structure of signal transmission paths in the semiconductor device PKG1. First, an overview of the semiconductor device PKG1 will be described and then a structure of the signal transmission paths will be described. FIG. 3 is a top view of one semiconductor device of the two semiconductor devices shown in FIG. 1. FIG. 4 is a bottom view of the semiconductor device shown in FIG. 3. FIG. 5 is a plan view illustrating an internal structure of the semiconductor device over the wiring substrate with the heat sink shown in FIG. 3 removed. FIG. 6 is a sectional view taken along line A-A of FIG. 3. FIG. 7 is a plan view of an electrode placement surface of the semiconductor chip shown in FIG. 6.

In the description of the present embodiment, implementations in which a number of terminals or a number of capacitors is small are taken as an example. However, a number of terminals or a number of capacitors is not limited to the examples taken in relation to the present embodiment and various modifications are applicable.

The semiconductor device PKG1 in the present embodiment includes a wiring substrate SUB1 and a semiconductor chip CHP1 (Refer to FIG. 5) mounted over the wiring substrate SUB1.

In an example of the present embodiment, the semiconductor device PKG1 includes a plurality of capacitors CPS (Refer to FIG. 5) and a plurality of capacitors CDC (Refer to FIG. 5) mounted over the wiring substrate SUB1.

As illustrated in FIG. 6, the wiring substrate SUB1 has: a top surface (face, main surface, chip placement surface, first main surface) 2t over which the semiconductor chip CHP1 is placed; and a bottom surface (face, main surface, mounting surface, second main surface) 2b on the opposite side to the top surface 2t. Further, the wiring substrate SUB1 has a plurality of side surfaces 2s (Refer to FIG. 3 to FIG. 5) intersecting with respective outer edges of the top surface 2t and the bottom surface 2b. In the case of the present embodiment, each of the top surface 2t (Refer to FIG. 3) and bottom surface 2b (Refer to FIG. 4) of the wiring substrate SUB1 is rectangular.

The wiring substrate SUB1 is an interposer (relay board) electrically coupling the semiconductor chip CHP1 placed over the top surface 2t and the circuit board MB1 (Refer to FIG. 1) as a mother board (mount board) with each other. The wiring substrate SUB1 includes a plurality of wiring layers (10 layers in the example shown in FIG. 6) WL1, WL2, WL3, WL4, WLS, WL6, WL7, WL8, WL9, WL10 electrically coupling terminals on the side of the top surface 2t as a chip placement surface and terminals on the side of the bottom surface 2b as amounting surface. Each wiring layer includes a conductor pattern of wiring and the like as a path for supplying electrical signals and electric power. An insulating layer 2e is placed between the individual wiring layers. The wiring layers are electrically coupled with one another through vias 2v or through hole wirings 2THW as interlayer conductive paths penetrating the insulating layers 2e.

Most of the wiring layer WL1 located closest to the top surface 2t among the wiring layers is covered with an insulating layer SR1 as a solder resist film. Most of the wiring layer WL10 located closest to the bottom surface 2b among the wiring layers is covered with an insulating layer SR2 as a solder resist film. The wiring substrate SUB1 is formed by laminating a plurality of wiring layers on the top surface 2Ct and the bottom surface 2Cb of an insulating layer (core material, core insulating layer) 2CR formed of, for example, prepreg obtained by impregnating glass fiber with resin by a build-up process. The wiring layer WL5 located on the top surface 2Ct side of the insulating layer 2CR and the wiring layer WL6 located on the bottom surface 2Cb side are electrically coupled with each other via a plurality of through hole wirings 2THW buried in a plurality of through holes provided so as to penetrate the insulating layer from one of the top surface 2Ct and the bottom surface 2Cb to the other.

In the top surface 2t of the wiring substrate SUB1, a plurality of pads (terminals, bonding pads, bonding leads, semiconductor chip coupling terminals) 2PD electrically coupled with the semiconductor chip CHP1 are formed. In the bottom surface 2b of the wiring substrate SUB1, a plurality of lands 2LD as external input/output terminals of the semiconductor device PKG1 are formed. The pads 2PD and the lands 2LD are respectively electrically coupled with each other via wirings 2d, vias 2v, and through hole wirings 2THW formed in the wiring substrate SUB1.

In the example shown in FIG. 6, the wiring substrate SUB1 is shown as a wiring substrate formed by laminating a plurality of wiring layers on each of the top surface 2Ct side and the bottom surface 2Cb side of the insulating layer 2CR as a core material. As a modification to FIG. 6, a so-called coreless substrate may be used which is not provided with an insulating layer 2CR formed of a hard material such as prepreg material and is formed by sequentially laminating conductor patterns of insulating layers 2e and wirings 2d. In cases where a coreless substrate is used, a through hole wiring 2THW is not formed and each wiring layer is electrically coupled through vias 2v. In the description in relation to FIG. 6, the wiring substrate SUB1 including 10 wiring layers is taken as an example. As a modification, for example, a wiring substrate including 11 or more or eight or less wiring layers may be used.

In the example shown in FIG. 6, a solder ball (solder material, external terminal, electrode, external electrode) SB is coupled to each of the lands 2LD. The solder ball SB is a conductive member that electrically couples the terminals (not shown) on the circuit board MB1 side and the lands 2LD with each other when the semiconductor device PKG1 is mounted over the circuit board MB1 shown in FIG. 1. The solder ball SB is, for example, a Sn-Pb solder material containing lead (Pb) or a solder material comprised of so-called lead-free solder that substantially does not contain Pb. Examples of lead-free solder are only tin (Sn), tin-bismuth (Sn—Bi), or tin-copper-silver (Sn—Cu—Ag), tin-copper (Sn—Cu) and the like. The lead-free solder cited here means those with a lead (Pb) content of 0.1 wt % or less and this content is stipulated as a basis of the RoHS (Restriction of Hazardous Substances) directive.

As shown in FIG. 4, the solder balls SB are arranged in a matrix (array). Though not shown in FIG. 4, the lands 2LD (Refer to FIG. 6) to which the solder balls SB are joined are also arranged in a matrix. A semiconductor device in which a plurality of external terminals (solder balls SB, lands 2LD) are arranged in a matrix on the mounting surface side of a wiring substrate SUB1 is designated as area array-type semiconductor device. The area array-type semiconductor device makes it possible to effectively utilize the mounting surface (bottom surface 2b) side of a wiring substrate SUB1 as a disposing space for external terminals. Therefore, the area array-type semiconductor device is preferable in that if a number of external terminals is increased, increase in the footprint of a semiconductor device can be suppressed. That is, a semiconductor device in which a number of external terminals is increased in conjunction with enhancement of functionality and increase in packaging density can be mounted in a space-saving manner.

The semiconductor device PKG1 has the semiconductor chip CHP1 mounted over the wiring substrate SUB1. As illustrated in FIG. 6, each semiconductor chip CHP1 has a front surface (main surface, top surface) 3t and a back surface (main surface, bottom surface) 3b on the opposite side to the front surface 3t. Further, the semiconductor chip CHP1 has a plurality of side surfaces 3s intersecting with the front surface 3t and the back surface 3b. As shown in FIG. 5, the semiconductor chip CHP1 forms a rectangular outside shape smaller in plane area than the wiring substrate SUB1 as viewed in a plane. In the example shown in FIG. 5, the semiconductor chip CHP1 is mounted in a central part of the top surface 2t of the wiring substrate SUB1 and each of the four side surfaces 3s of the semiconductor chip CHP1 is extended along each of the four side surfaces 2s of the wiring substrate SUB1.

As shown in FIG. 7, on the front surface 3t side of the semiconductor chip CHP1, a plurality of electrodes (pads, electrode pads, bonding pads) 3PD are formed. The electrodes 3PD are exposed from an insulating film (passivation film, protective insulating film) 3PF covering most of the front surface 3t of the semiconductor chip CHP1 in the front surface 3t of the semiconductor chip CHP1. The electrodes 3PD are arranged in a plurality of rows from the outermost edge closest to the outer edge of the front surface 3t toward the center of the front surface 3t in the front surface 3t. In the present embodiment, in the front surface 3t of the semiconductor chips CHP1, the electrodes 3PD are arranged in a matrix (array). Matrix arrangement of the electrodes 3PD of the semiconductor chip CHP1 makes it possible to effectively utilize the front surface 3t of the semiconductor chip CHP1 as an electrode disposing space. Therefore, this arrangement is preferable in that if a number of electrodes of the semiconductor chip CHP1 is increased, increase in plane area can be suppressed. However, though not shown in a drawing, as a modification to the present embodiment, the present invention is also applicable to a semiconductor chip of such a type that a plurality of electrodes 3PD are disposed on the periphery of the front surface 3t but not in the central part.

In the example shown in FIG. 6, the semiconductor chip CHP1 is mounted over the wiring substrate SUB1 with the front surface 3t opposed to the top surface 2t of the wiring substrate SUB1. This mounting scheme is designated as surface down mounting scheme or flip chip bonding scheme.

Though not shown in a drawing, a plurality of semiconductor elements (circuit elements) are formed in a main surface of the semiconductor chip CHP1 (specifically, a semiconductor element formation region provided in an element formation surface of a semiconductor substrate as a base material of the semiconductor chip CHP1). The electrodes 3PD are respectively electrically coupled with these semiconductor elements via wirings (not shown) formed in wiring layers disposed in the interior of the semiconductor chip CHP1 (specifically, between the front surface 3t and the semiconductor element formation region, not shown).

The semiconductor chip CHP1 (specifically, base material of the semiconductor chip CHP1) is formed of, for example, silicon (Si). In the front surface 3t, an insulating film 3PF (Refer to FIG. 7) is formed covering the base material and the wirings of the semiconductor chip CHP1. A part of each of the electrodes 3PD is exposed from the insulating film 3PF at an opening formed in the insulating film 3PF. Each of the electrodes 3PD is formed of metal, for example, aluminum (Al) in the present embodiment.

As shown in FIG. 6, a bump electrode 3BP is coupled to each of the electrodes 3PD and the electrodes 3PD of the semiconductor chip CHP1 and the pads 2PD of the wiring substrate SUB1 are respectively electrically coupled with each other via the bump electrodes 3BP. The bump electrode 3BP is a metal member (conductive member) formed so as to protrude to above the front surface 3t of the semiconductor chip CHP1. In the present embodiment, the bump electrode 3BP is a so-called solder bump formed by laminating solder material with a base metal film (under bump metal) in between over each electrode 3PD. As an example of the base metal film, a laminated film can be taken which is formed by laminating titanium (Ti), copper (Cu), and nickel (Ni) from the side of a surface bonded with the electrode 3PD. (In some cases, a gold (Au) film may be additionally formed over the nickel film.) As a solder material for forming the solder bumps, a solder material containing lead or lead-free solder can be used as for the solder balls SB. To mount the semiconductor chip CHP1 over the wiring substrate SUB1, solder bumps are formed both on the electrodes 3PD and on the pads 2PD in advance and heat treatment (ref low treatment) is conducted with the solder bumps in contact with each other. As a result, the solder bumps are integrated and the bump electrodes 3BP are formed. As a modification to the present embodiment, a pillar bump (columnar electrode) obtained by forming a solder film on a tip face of a conductor pillar comprised of copper (Cu) or nickel (Ni) may be used as the bump electrode 3BP.

As shown in FIG. 6, underfill resin (insulative resin) UF is placed between the semiconductor chip CHP1 and the wiring substrate SUB1. The underfill resin UF is disposed so as to fill a gap between the front surface 3t of the semiconductor chip CHP1 and the top surface 2t of the wiring substrate SUB1. The underfill resin UF is comprised of an insulative (nonconductive) material (for example, resin material) and is disposed so as to seal an electrical coupling portion between the semiconductor chip CHP1 and the wiring substrate SUB1 (joining areas of the bump electrodes 3BP). By covering the joining areas between the bump electrodes 3BP and the pads 2PD with the underfill resin UF as mentioned above, it is made possible to mitigate stress produced in the electrical coupling portions between the semiconductor chip CHP1 and the wiring substrate SUB1. It is also possible to mitigate stress produced in the joining areas between the electrodes 3PD of the semiconductor chip CHP1 and the bump electrodes 3BP. Further, it is possible to protect the main surface of the semiconductor chip CHP1 where semiconductor elements (circuit elements) are formed.

In the example shown in FIG. 6, a heat sink (heat spreader, heat dissipating member) HS is stuck to the back surface 3b of the semiconductor chip CHP1. The heat sink HS is, for example, a metal plate higher in thermal conductivity than the wiring substrate SUB1 and has a function of discharging heat produced in the semiconductor chip CHP1 to the outside. The heat sink HS is stuck to the back surface 3b of the semiconductor chip CHP1 via bonding material (heat radiating resin) BDhs. The bonding material BDhs is made to contain a large number of metal particles or filler (for example, alumina) and is thereby made higher in thermal conductivity than the underfill resin UF.

In the example shown in FIG. 5 and FIG. 6, a support frame (stiffener ring) SFR supporting the heat sink HS (Refer to FIG. 6) is secured in an area surrounding the semiconductor chip CHP1. The heat sink HS is bonded and secured on the back surface 3b of the semiconductor chip CHP1 and the support frame SFR. As the result of the metallic support frame SFR being secured in the area surrounding the semiconductor chip CHP1, warping of the wiring substrate SUB1 can be suppressed; therefore, it is desirable in terms of enhancement of mounting reliability. By bonding and securing the heat sink HS on the support frame SFR provided so as to surround the semiconductor chip CHP1, a plane area of the heat sink HS can be increased. That is, it is desirable to bond and secure the heat sink HS on the support frame SFR in a view point in which heat dissipation capability can be enhanced by ensuring a large surface area of the heat sink HS and the heat sink is stably secured over the semiconductor chip CHP1.

In the description of the present embodiment, an implementation in which the heat sink HS is stuck to the back surface 3b of the semiconductor chip CHP1 is taken as an example. As a modification, a heat sink HS may be not attached and the back surface 3b of the semiconductor chip CHP1 may be exposed.

As shown in FIG. 5, the semiconductor device PKG1 include a plurality of capacitors CDC, CPS mounted over the wiring substrate SUB1. The capacitors CDC, CPS include a capacitor CDC as a capacitor for DC cut and a capacitor CPS for power supply circuit used as a bypass capacitor, a decoupling capacitor, or a battery. In FIG. 5, some of the capacitors CDC, CPS are marked with a reference symbol. The capacitors placed inside the support frame SFR as viewed in a plane are all capacitors CPS and the capacitors CDC are placed outside the support frame SFR.

Each of the capacitors CDC is inserted into the high-speed transmission paths SGPH by series coupling as mentioned above. Insertion of a capacitor CDC in a high-speed transmission path SGPH by series coupling is expressed as follows: as shown in FIG. 2, each signal electrode Rxp, Rxn is electrically coupled with a land LDH for high-speed transmission with a capacitor CDC in between. Specifically, one electrode of a capacitor CDC is coupled to the signal electrode Rxp or signal electrode Rxn of the semiconductor chip CHP1 and the other electrode of the capacitor CDC is coupled to a land LDH for high-speed signals. The signal electrodes TxL, RxL configuring the low-speed transmission paths SGPL and lands LDL for low-speed signals are electrically coupled with each other without a capacitor CDC in between.

In the example shown in FIG. 2, a capacitor CDC is coupled to a signal transmission path SGPR transmitting signals SGR (Refer to FIG. 1) of the high-speed transmission paths SGPH provided in the semiconductor device PKG1. Meanwhile, a capacitor CDC is not coupled to the signal transmission paths SGPR of the semiconductor device PKG2. A direct-current component included in signals SGT (Refer to FIG. 1) as output signals of the semiconductor device PKG1 is cut by a capacitor CDC of the semiconductor device PKG2 before being inputted to the semiconductor chip CHP2 of the semiconductor device PKG2. As a modification, however, a capacitor CDC may be coupled to both the signal transmission paths SGPT and the signal transmission paths SGPR of the semiconductor device PKG1. Alternatively, a configuration in which a capacitor CDC is coupled only to the signal transmission paths SGPT of the semiconductor device PKG1 and a capacitor CDC is not coupled to the signal transmission paths SGPR is also acceptable.

Each of the capacitors CPS is inserted into a power supply circuit by parallel coupling so as to connect first potential and second potential of the power supply circuit with each other. Insertion of a capacitor CPS into a power supply circuit by parallel coupling is expressed as follows: as illustrated in FIG. 2, the electrodes 3PD (Refer to FIG. 8, described later) provided in the semiconductor chip CHP1 include an electrode (electrode pad) Vs supplied with reference potential VSS and an electrode (electrode pad) Vd supplied with power supply potential VDD. The lands 2LD provided in the wiring substrate SUB1 include a land LVs supplied with reference potential VSS and a land LVd supplied with power supply potential VDD. One electrode of a capacitor CPS is coupled to a reference potential supply path VSP coupling the reference potential electrode Vs and the land LVs with each other and the other electrode of the capacitor CPS is coupled to a power supply potential supply path VDP coupling the power supply potential electrode Vd and the land LVd with each other.

Example Configuration of High-Speed Transmission Path

Figure 8:
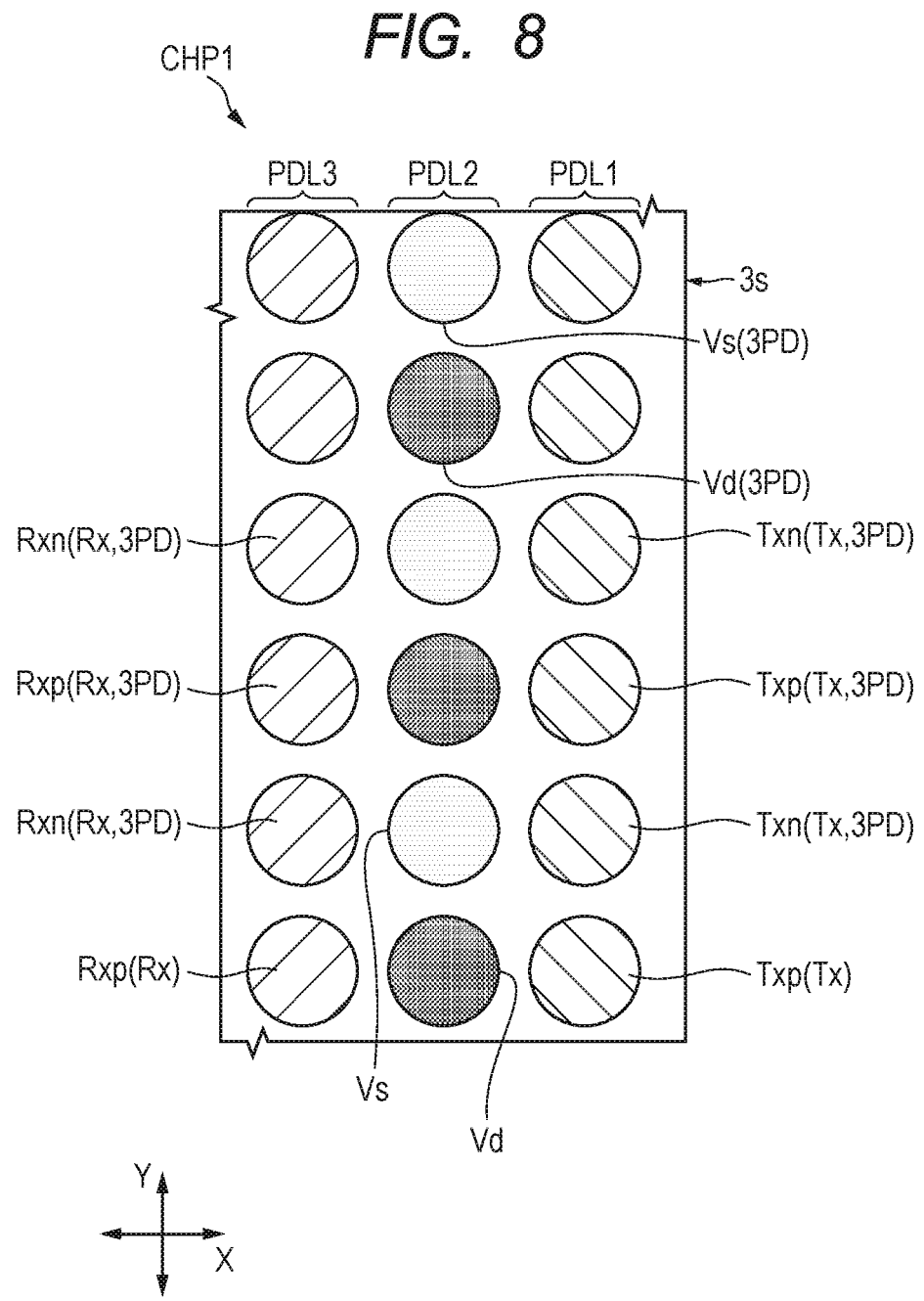
FIG. 8 is an enlarged plan view of part A of FIG. 7.
Figure 9:
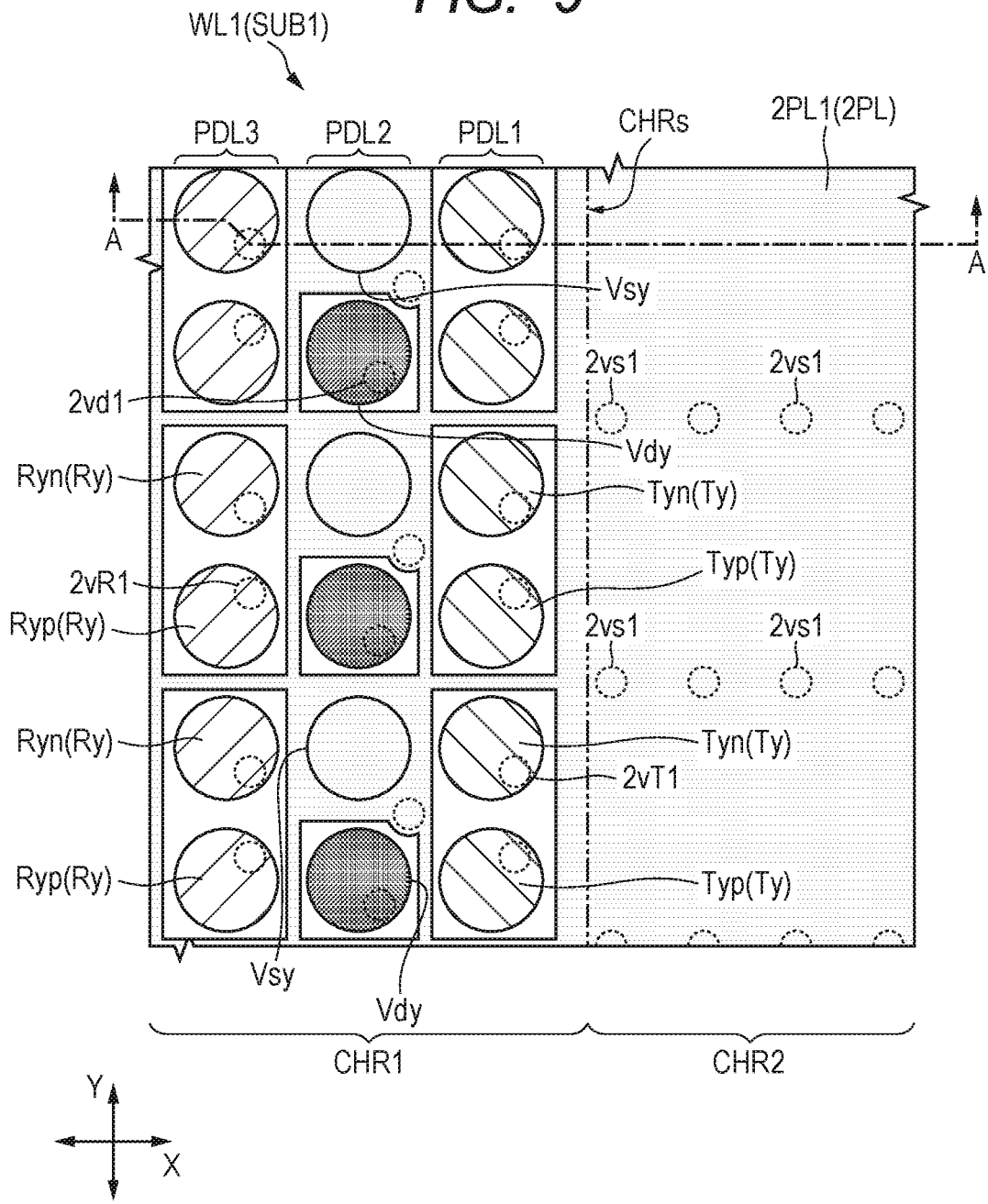
FIG. 9 is an enlarged plan view showing in an enlarged manner the vicinity of terminals opposed to a plurality of electrodes shown in FIG. 8 in the upper surface of the wiring substrate shown in FIG. 6.
Figure 10:
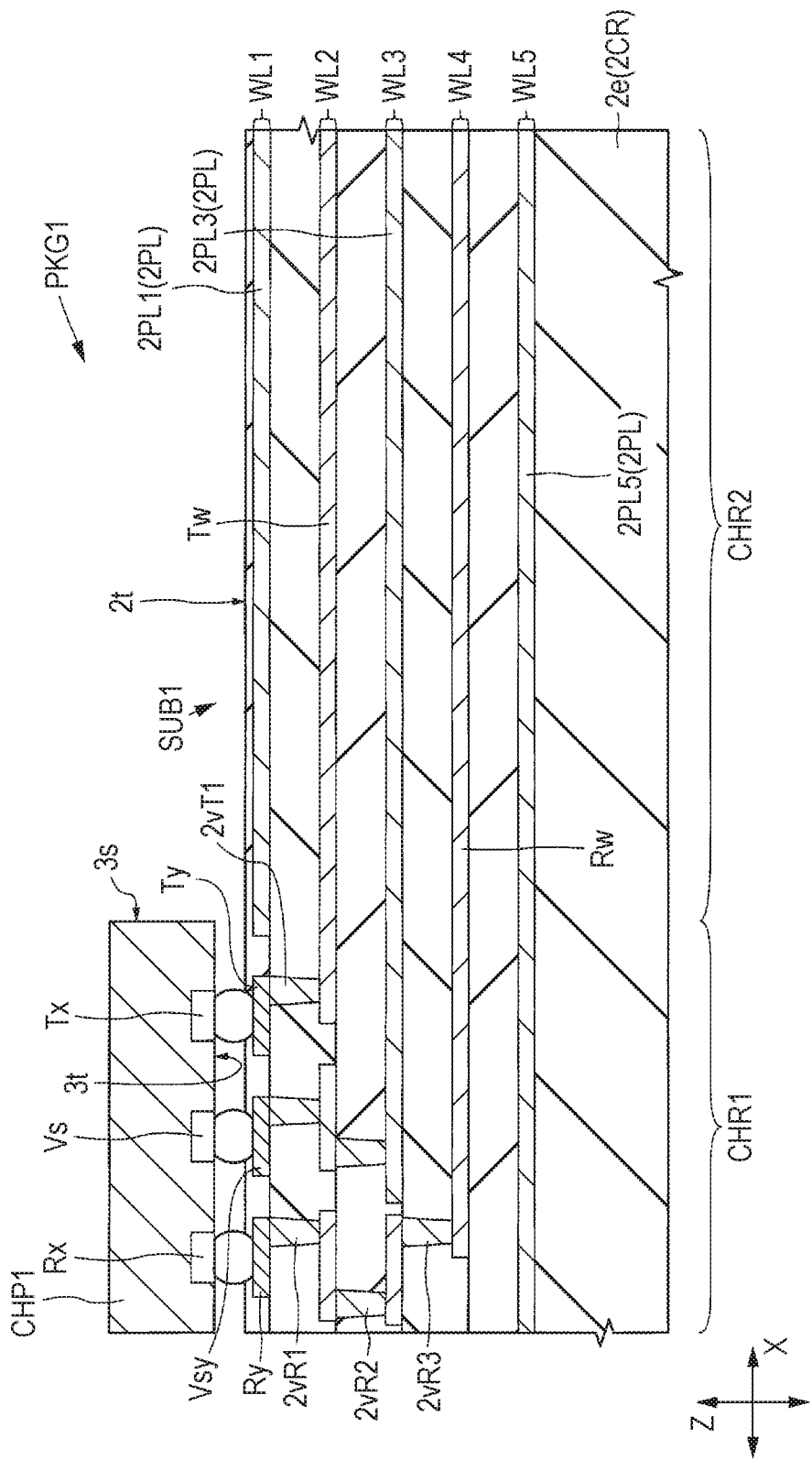
FIG. 10 is an enlarged sectional view taken along line A-A of FIG. 9.
Figure 11:
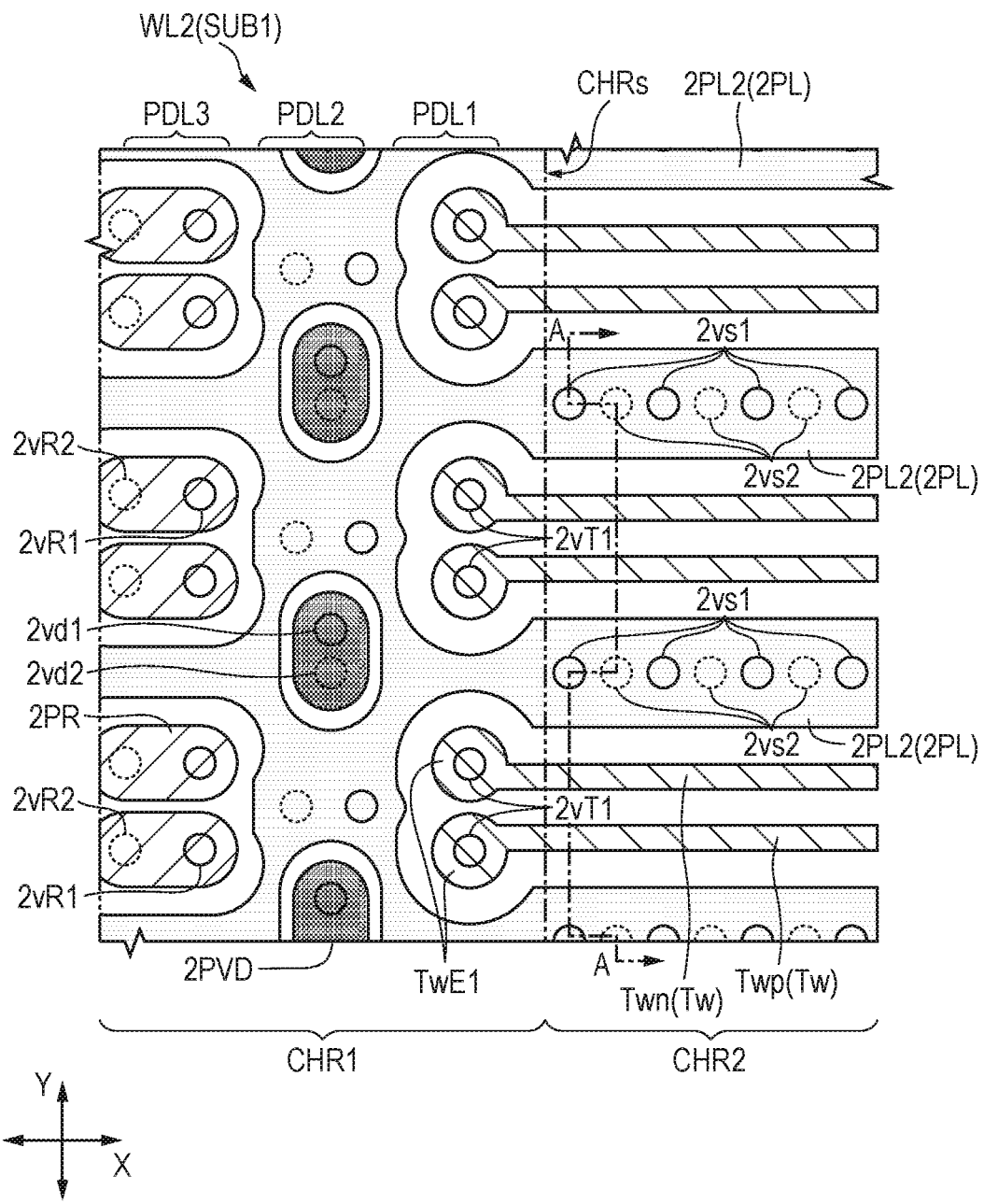
FIG. 11 is an enlarged plan view of a wiring layer (second layer) lower than the wiring layer shown in FIG. 9.
Figure 12:
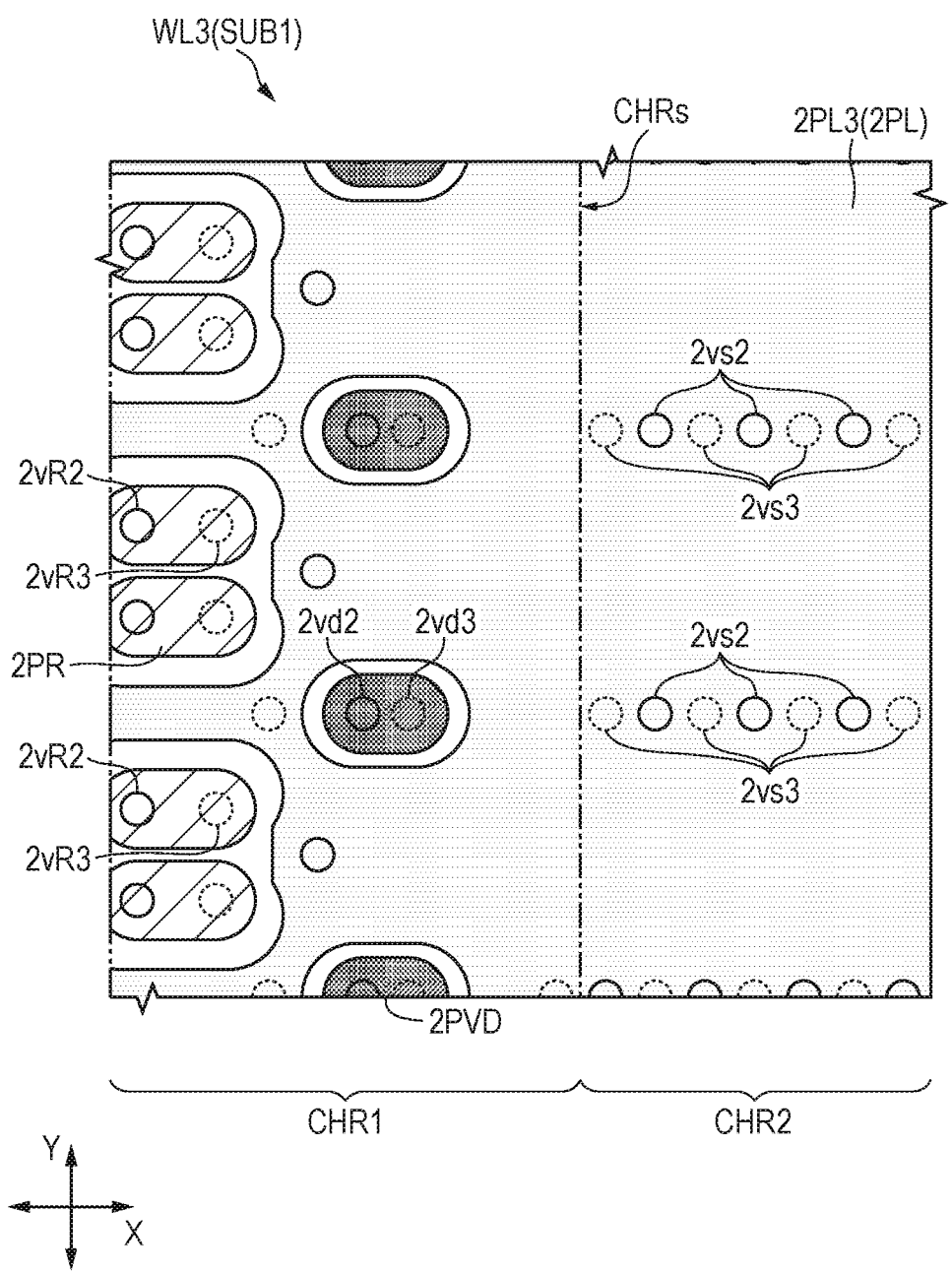
FIG. 12 is an enlarged plan view of a wiring layer (third layer) lower than the wiring layer shown in FIG. 11.
Figure 13:
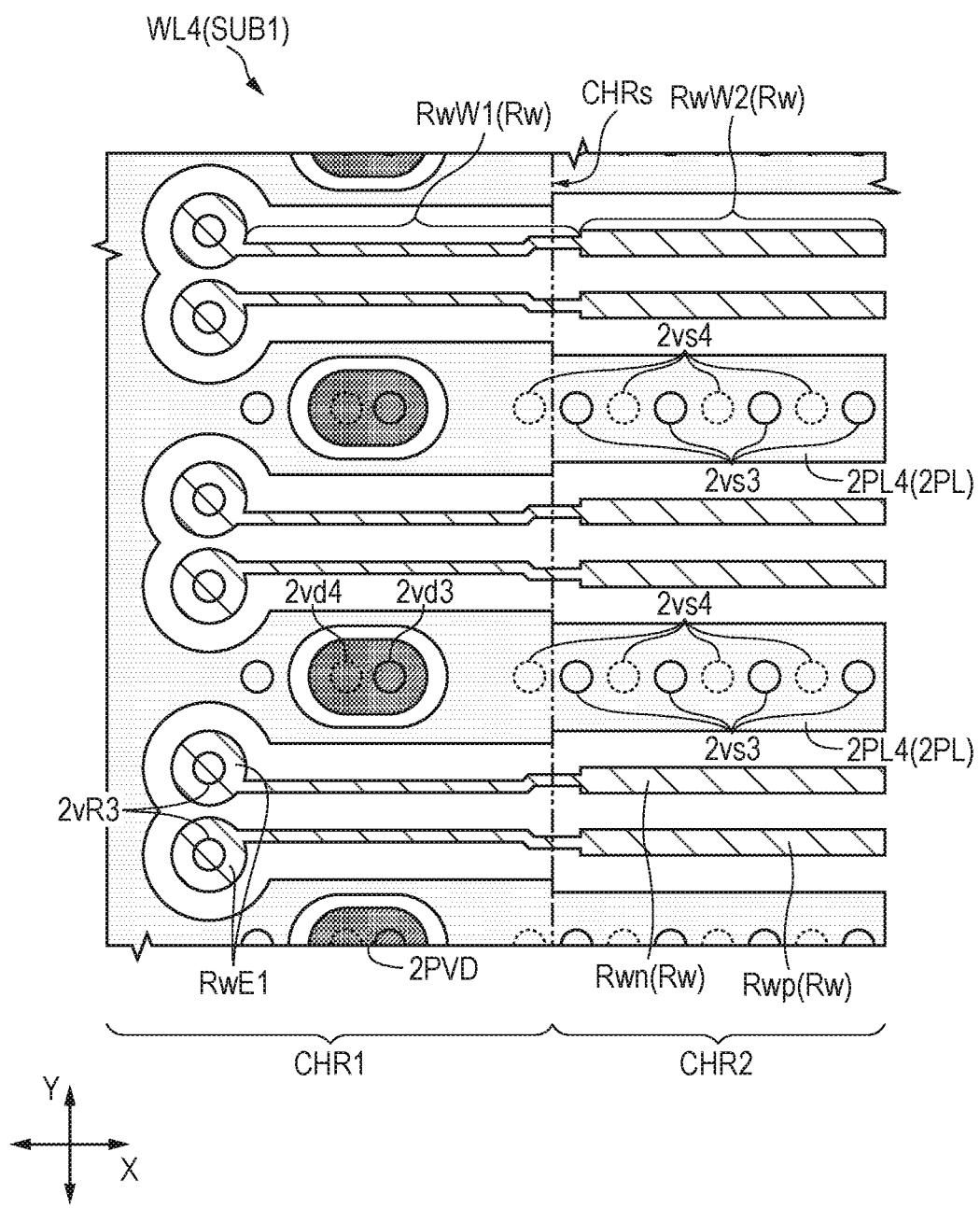
FIG. 13 is an enlarged plan view of a wiring layer (fourth layer) lower than the wiring layer shown in FIG. 12.
Figure 14:
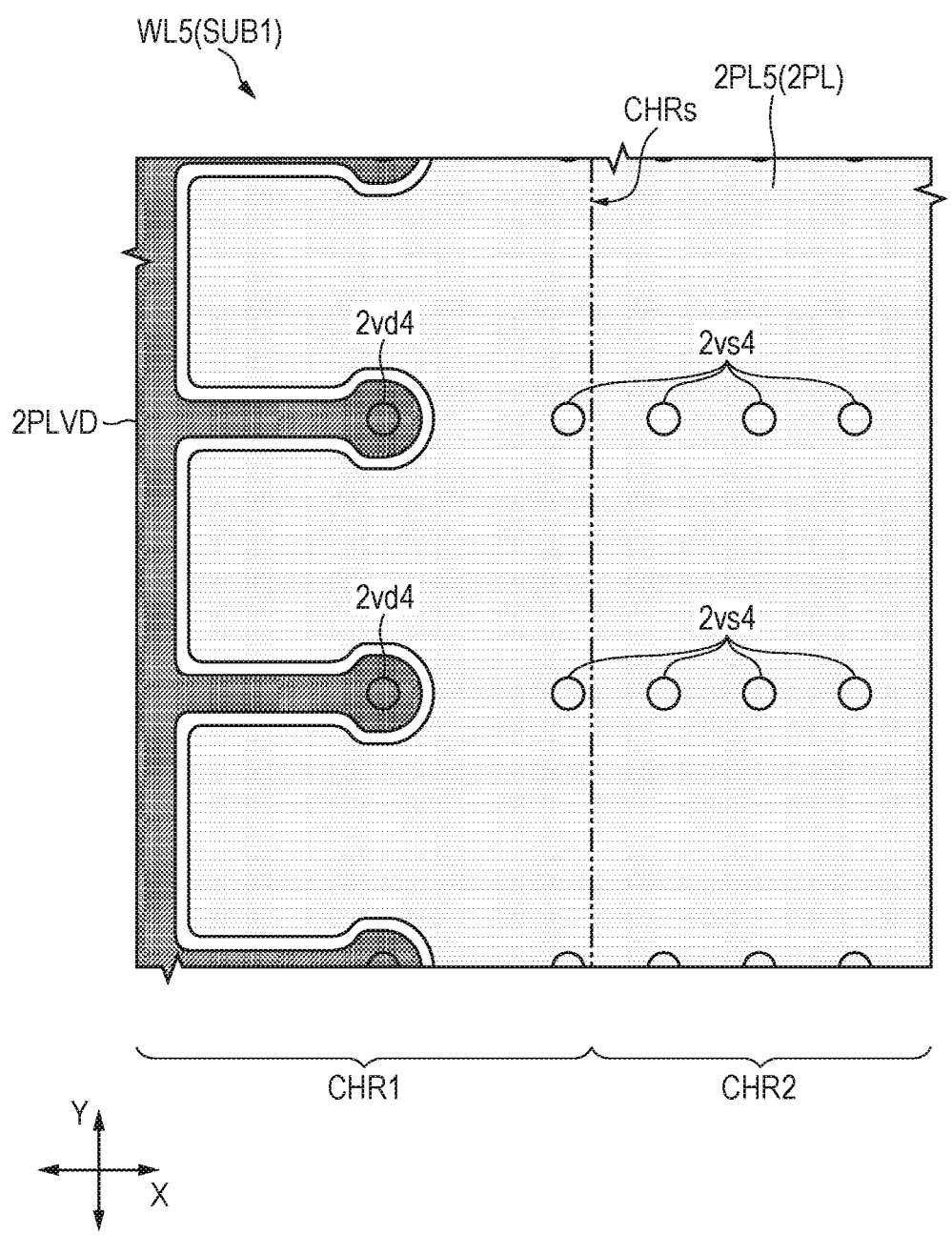
FIG. 14 is an enlarged plan view of a wiring layer (fifth layer) lower than the wiring layer shown in FIG. 13.
Figure 15:
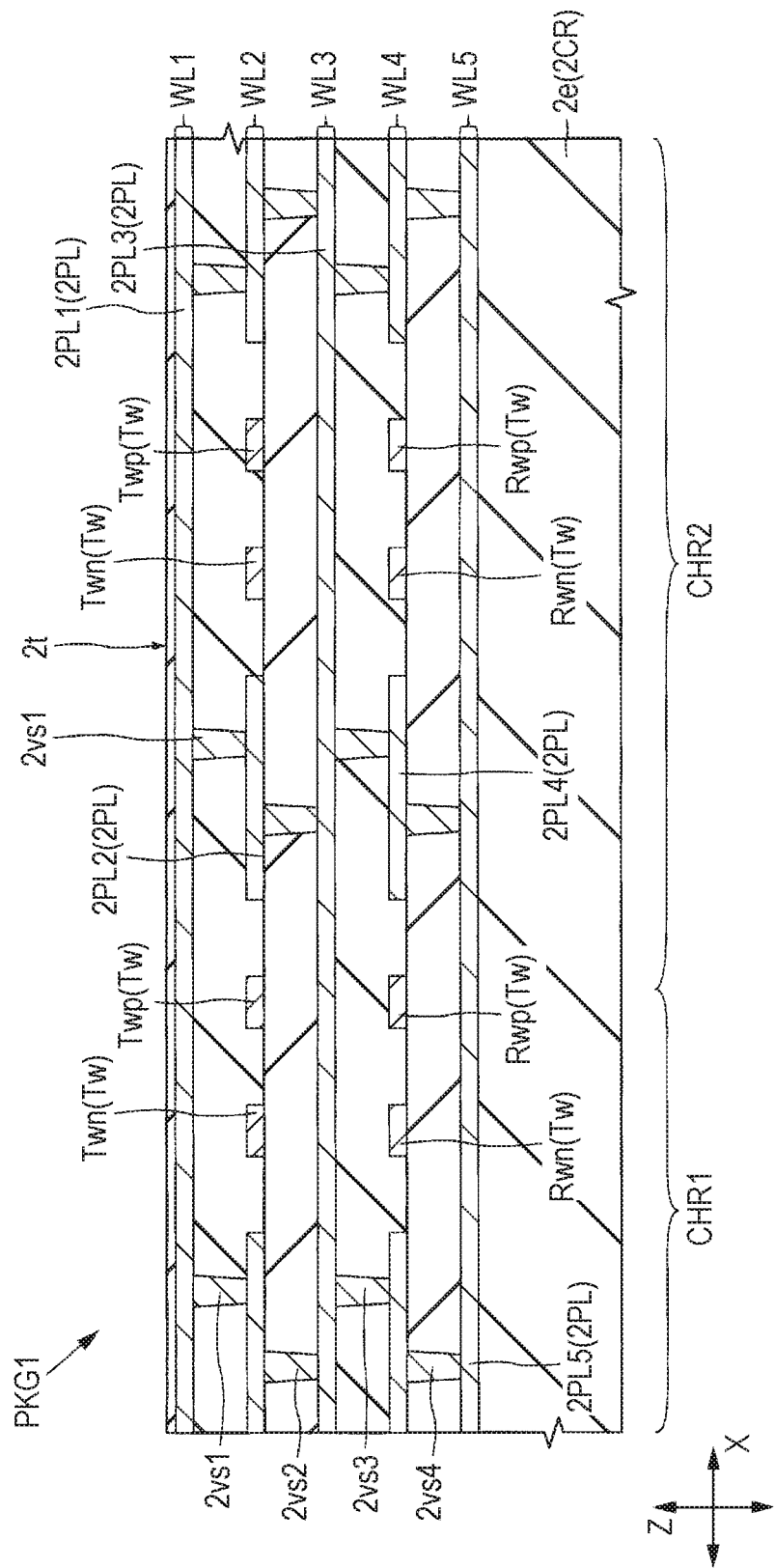
FIG. 15 is an enlarged sectional view taken along line A-A of FIG. 11.

A description will be given to a wiring structure of a high-speed transmission path provided in the semiconductor device PKG1. FIG. 8 is an enlarged plan view of part A of FIG. 7. FIG. 9 is an enlarged plan view illustrating in an enlarged manner the vicinity of terminals opposed to a plurality of electrodes shown in FIG. 8 in the top surface of the wiring substrate shown in FIG. 6. FIG. 10 is an enlarged sectional view taken along line A-A of FIG. 9. FIG. 11 is an enlarged plan view of a wiring layer (second layer) lower than the wiring layer shown in FIG. 9. FIG. 12 is an enlarged plan view of a wiring layer (third layer) lower than the wiring layer shown in FIG. 11. FIG. 13 is an enlarged plan view of a wiring layer (fourth layer) lower than the wiring layer shown in FIG. 12. FIG. 14 is an enlarged plan view of a wiring layer (fifth layer) lower than the wiring layer shown in FIG. 13. FIG. 15 is an enlarged sectional view taken along line A-A of FIG. 11. Each of the wiring layers of the wiring substrate SUB1 shown in FIG. 6 includes a region (chip superposed region) CHR1 (Refer to FIG. 9) overlapping with the semiconductor chip CHP1. In FIG. 9 and FIG. 11 to FIG. 14, the sides CHRs at the outer edge of the region CHR1 are indicated by an alternate long and two short dashes line. In FIG. 8, FIG. 9, and FIG. 11 to FIG. 14, hatching or a pattern is provided for identifying types of signals and potential supplied to each transmission path as in FIG. 7. The transmission paths for output signals (transmit signals) and the transmission paths for input signals (receive signals) are differently hatched. The transmission path for reference potential is provided with a dot pattern. The transmission path for power supply potential is provided with a denser dot pattern than for the transmission path for reference potential.

Figure 16:
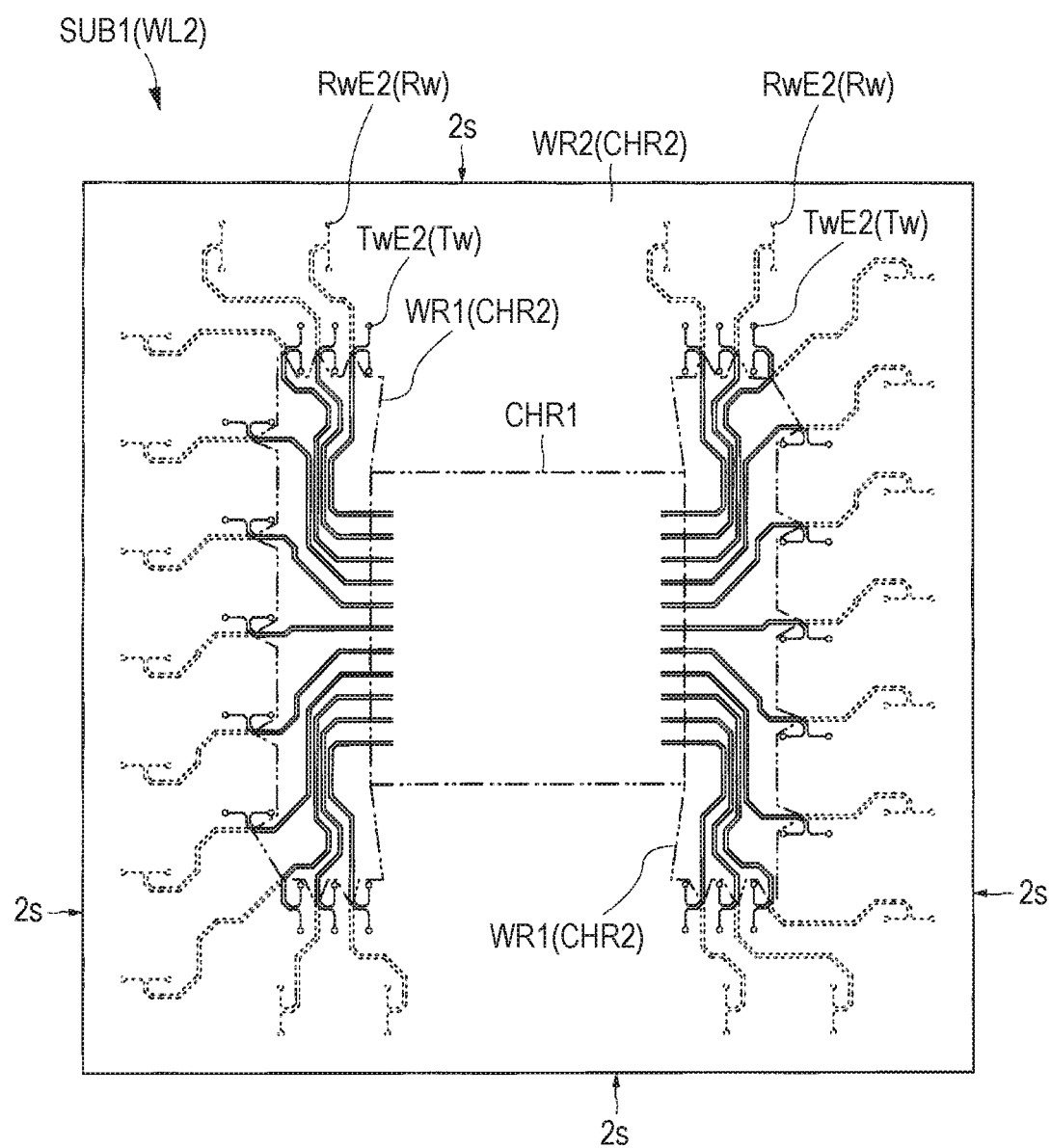
FIG. 16 is a plan view of the second wiring layer of the wiring substrate shown in FIG. 6.
Figure 17:
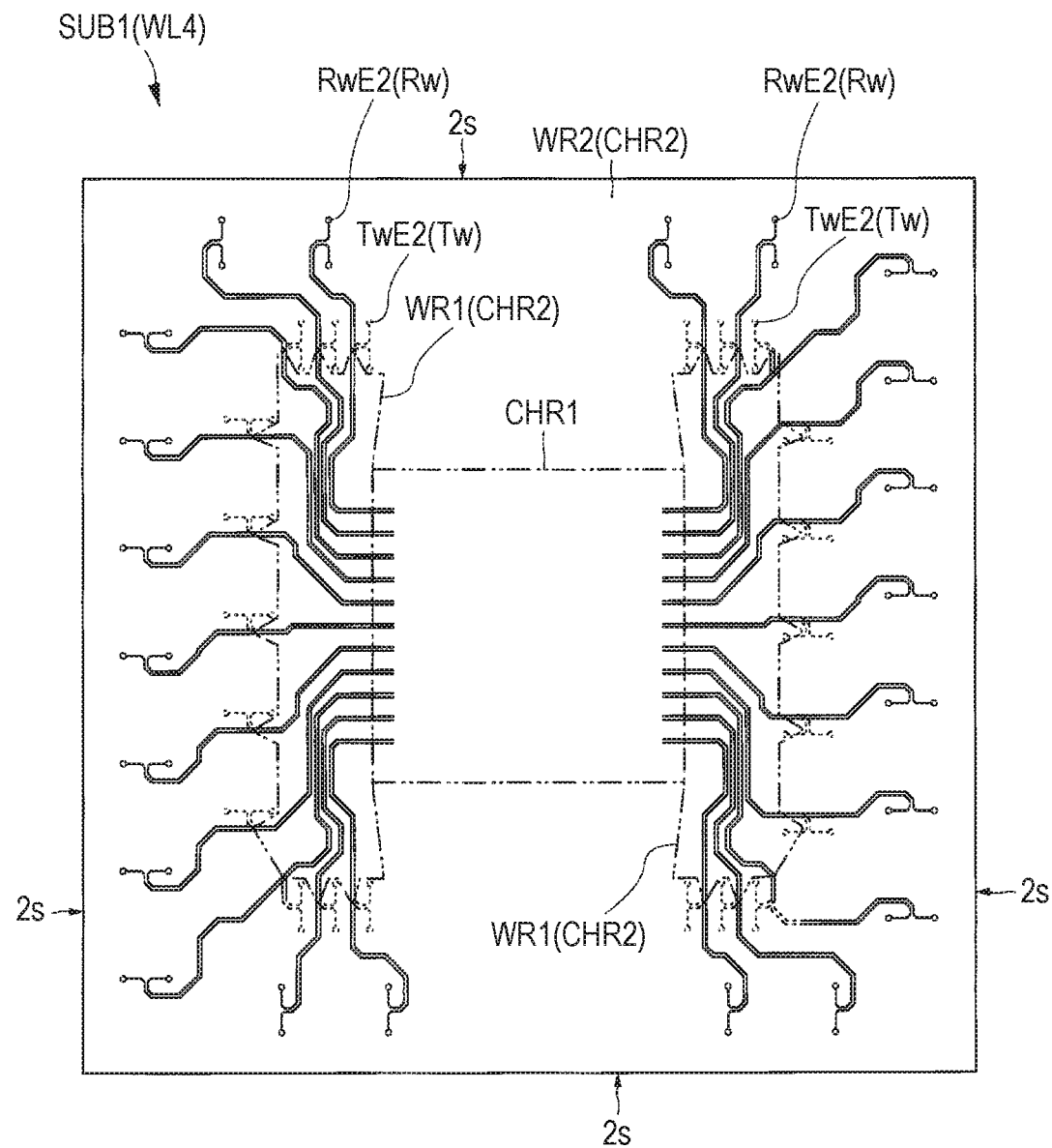
FIG. 17 is a plan view of the fourth wiring layer of the wiring substrate shown in FIG. 16.

FIG. 16 is a plan view of the second wiring layer of the wiring substrate shown in FIG. 6 and FIG. 17 is a plan view of the fourth wiring layer of the wiring substrate shown in FIG. 6. To make a region where a signal wiring Tw and a signal wiring Rw overlap with each other easily identifiable, signal wirings Rw are indicated by a dotted line in FIG. 16 and signal wirings Tw are indicated by a dotted line in FIG. 17. In FIG. 16 and FIG. 17, borders between a region CHR1 and a region WR1 where a signal wiring Tw and a signal wiring Rw run parallel with a wiring layer WL3 in between and a region WR2 where a signal wiring Tw and signal wiring Rw do not overlap with each other are indicated by an alternate long and two short dashes line.

As described with reference to FIG. 2, the electrodes 3PD (Refer to FIG. 7) provided in the semiconductor chip CHP1 include a signal electrode Tx for transmitting signals SGT (Refer to FIG. 1) as output signals. The electrodes 3PD provided in the semiconductor chip CHP1 include a signal electrode Rx for transmitting signals SGR (Refer to FIG. 1) as input signals. The electrodes 3PD provided in the semiconductor chip CHP1 include a power supply potential electrode Vd supplied with power supply potential VDD and a reference potential electrode Vs supplied with reference potential VSS.

The signal electrodes Tx are electrically coupled to lands 2LD as external input/output terminals of the semiconductor device PKG1 through the signal pads Ty and vias $2vT1$ shown in FIG. 9, the signal wirings Tw shown in FIG. 11 and vias $2v$ (or through hole wirings 2THW) electrically coupling each wiring layer of the wiring layer WL2 to the wiring layer WL10 shown in FIG. 6. The signal electrodes Rx are electrically coupled to lands 2LD as external input/output terminals of the semiconductor device PKG1 through the signal pads Ry and the vias $2vR1$, $2vR2$, $2vR3$ shown in FIG. 10, the signal wirings Rw shown in FIG. 13 and vias $2v$ or through hole wirings 2THW electrically coupling each wiring layer of the wiring layers WL1 to the wiring layer WL10 shown in FIG. 6.

As shown in FIG. 2, a capacitor CDC is inserted into a transmission path for input signals by series coupling. In the case of the present embodiment, the capacitors CDC are mounted over the top surface $2t$ of the wiring substrate SUB1 as shown in FIG. 6. For this reason, a signal SGR (Refer to FIG. 1) inputted from a land 2LD is coupled to a signal wiring Rw in the wiring layer WL4 shown in FIG. 13 by way of a capacitor CDC over the top surface $2t$. As shown in FIG. 2, a capacitor CDC is not coupled to a transmission path for output signals within the semiconductor device PKG1. For this reason, a signal SGT (Refer to FIG. 1) outputted from the semiconductor chip CHP1 shown in FIG. 6 is transmitted from the wiring layer WL1 toward the wiring layer WL10 and is outputted from a land 2LD.

The power supply potential electrode Vd is electrically coupled to a land 2LD through the power supply potential pad Vdy and the via $2vd1$ shown in FIG. 9, the conductor pattern 2PVD and the via $2vd2$ shown in FIG. 11, the conductor pattern 2PVD and the via $2vd3$ shown in FIG. 12, the conductor pattern 2PVD and the via $2vd4$ shown in FIG. 13, the conductor plane 2PLVD shown in FIG. 14 and a via $2v$ or a through hole wiring 2THW electrically coupling each wiring layer of the wiring layer WL5 to the wiring layer WL10 shown in FIG. 6. The reference potential electrode Vs is electrically coupled to a land 2LD through the reference potential pad Vsy, the via $2vs1$, and the conductor plane 2PL1 shown in FIG. 9, the conductor plane 2PL2 and the via $2vs2$ shown in FIG. 11, the conductor plane 2PL3 and the via $2vs3$ shown in FIG. 12, the conductor plane 2PL4 and the via $2vs4$ shown in FIG. 13, the conductor plane 2PL5 shown in FIG. 14 and a via $2v$ or a through hole wiring 2THW electrically coupling each wiring layer of the wiring layer WL5 to the wiring layer WL10 shown in FIG. 6.

As shown in FIG. 8, in the front surface $3t$ of the semiconductor chip CHP1, a plurality of signal electrodes Tx are disposed in a row (first row) PDL1 between the outer edge of the front surface $3t$ and the center of the front surface $3t$. In the front surface $3t$ of the semiconductor chip CHP1, a plurality of power supply potential electrodes Vd and a plurality of reference potential electrodes Vs are disposed in a row (second row) PDL2 between the row PDL1 and the center of the front surface $3t$. In the front surface $3t$ of the semiconductor chip CHP1, a plurality of signal electrodes Rx are disposed in a row (third row) PDL3 between the row PDL2 and the center of the front surface $3t$. In the case of the present embodiment, transmitting wirings transmitting output signals (transmit signals) and receiving wirings transmitting input signals (receive signals) are disposed in different wiring layers. As the result of signal electrodes Tx for output and signal electrodes Rx for input being disposed in different rows, it is possible to simplify a layout of wirings in a wiring substrate as mentioned later and reduce crosstalk noise in output signals and input signals.

In the case of the present embodiment, each of the signals SGT and signals SGR shown in FIG. 1 is a differential signal. For this reason, the signal electrodes Tx include a signal electrode Txp and a signal electrode Txn from which a pair of differential signals are outputted. As shown in FIG. 8, a signal electrode Txp and a signal electrode Txn configuring a differential pair are arranged adjacently to each other in a Y direction that is an arrangement direction of signal electrodes Tx. The signal electrodes Rx include a signal electrode Rxp and a signal electrode Rxn to which a pair of differential signals are inputted. A signal electrode Rxp and a signal electrode Rxn configuring a differential pair are arranged adjacently to each other in the Y direction that is an arrangement direction of signal electrodes Rx.

As shown in FIG. 8, in the front surface $3t$ of the semiconductor chip CHP1, power supply potential electrodes Vd and reference potential electrodes Vs are alternately disposed in the Y direction in which the row PDL2 is extended. A supply path for reference potential may be utilized as a reference path for a signal transmission path. In this case, it is desirable that a clearance between the signal transmission path and the reference path should be constant. In cases where power supply potential electrodes Vd and reference potential electrodes Vs are alternately disposed in a direction in which the row PDL2 is extended as shown in FIG. 8, a reference path can be placed in proximity to each of signal transmission paths.

As shown in FIG. 6, the wiring substrate SUB1 includes the pads 2PD opposed to the electrodes 3PD of the semiconductor chip CHP1. Each of the pads 2PD is provided in the wiring layer WL1 closest to the chip placement surface among the wiring layers provided in the wiring substrate SUB1. As shown in FIG. 9, the pads 2PD (Refer to FIG. 6) provided in the wiring substrate SUB1 include signal pads Ty (specifically, a signal pad Typ and a signal pad Tyn from which a pair of differential signals are outputted) for transmitting signals SGT (Refer to FIG. 1) as output signals (transmit signals). The pads 2PD provided in the wiring substrate SUB1 include signal pads Ry (specifically, a signal pad Ryp and a signal pad Ryn to which a pair of differential signals are inputted) for transmitting signals SGR (Refer to FIG. 1) as input signals (receive signals). The pads 2PD provided in the wiring substrate SUB1 include a power supply potential pad Vdy supplied with power supply potential VDD and a reference potential pad Vsy supplied with reference potential VSS.

Each of the signal pads Ty is opposed to the signal electrodes Tx shown in FIG. 8. Each of the signal pads Ry is opposed to the signal electrodes Rx shown in FIG. 8. Each of the power supply potential pads Vdy is opposed to the power supply potential electrodes Vd shown in FIG. 8. Each of the reference potential pads Vsy is opposed to the reference potential electrodes Vs shown in FIG. 8.

In the region CHR1 of the wiring substrate SUB1, a plurality of signal pads Ty are disposed in a row (first row) PDL1 between a side CHRs of the outer edge of the region CHR1 and the center of the region CHR1. In the region CHR1 of the wiring substrate SUB1, a plurality of power supply potential pads Vdy and a plurality of reference potential pads Vsy are disposed in a row (second row) PDL2 between the row PDL1 and the center of the region CHR1. In the region CHR1 of the wiring substrate SUB1, a plurality of signal pads Ry are disposed in a row (third row) PDL3 between the row PDL2 and the center of the region CHR1.

As shown in FIG. 9, each of the wiring layers of the wiring substrate SUB1 includes: a region (chip superposed region) CHR1 overlapping with the semiconductor chip CHP1 (Refer to FIG. 6); and a region (non-chip superposed region, peripheral region) CHR2 that is located around the region CHR1 and does not overlap with the semiconductor chip CHP1. Each of the signal transmission paths is drawn from the region CHR1 to the region CHR2 in any of the wiring layers. In the case of the present embodiment, signal transmission paths for output signals and signal transmission paths for input signals are drawn from the region CHR1 to the region CHR2 in different wiring layers.

As shown in FIG. 10, the wiring layers of the wiring substrate SUB1 include: the wiring layer WL1 located between the top surface 2t and the bottom surface 2b (Refer to FIG. 6); the wiring layer WL2 located between the wiring layer WL1 and the bottom surface 2b; the wiring layer WL3 located between the wiring layer WL2 and the bottom surface 2b; the wiring layer WL4 located between the wiring layer WL3 and the bottom surface 2b; and the wiring layer WL5 located between the wiring layer WL4 and the bottom surface 2b. The signal transmission paths for output signals are drawn from the region CHR1 to the region CHR2 in the wiring layer WL2. The signal transmission paths for input signals are drawn from the region CHR1 to the region CHR2 in the wiring layer WL4.

A detailed description will be given. The wiring substrate SUB1 includes a plurality of signal wirings (signal lines) Tw formed in the wiring layer WL2 and respectively coupled to signal electrodes Tx (Refer to FIG. 8). As shown in FIG. 11, each of signal wirings Tw is electrically coupled with a signal pad Ty (Refer to FIG. 9) in the wiring layer WL1 (Refer to FIG. 9) through a via 2vT1. As viewed in a plane, a one-side end TwE1 of each of signal wirings Tw is located in the region CHR1. The via 2vT1 is coupled to the end TwE1 of the signal wiring Tw. The other-side end TwE2 (Refer to FIG. 16) of each of signal wirings Tw is located in the region CHR2. Each of signal wirings Tw is extended astride the border between the region CHR1 and the region CHR2.

As shown in FIG. 13, the wiring substrate SUB1 includes a plurality of signal wirings (signal lines) Rw formed in the wiring layer WL4 and respectively coupled to signal electrodes Rx (Refer to FIG. 8). Each of the signal wirings Rw is electrically coupled to a signal pad Ry (Refer to FIG. 9) of the wiring layer WL1 (Refer to FIG. 9) through the via 2vR1 (Refer to FIG. 10), the via 2vR2 (Refer to FIG. 10), and the via 2vR3. As viewed in a plane, one-side end RwE1 of each of the signal wirings Rw is located in the region CHR1. The via 2vR3 is coupled to the end RwE1 of the signal wiring Rw. The other-side end RwE2 (Refer to FIG. 17) of each of the signal wiring Rw is located in the region CHR2. Each of the signal wirings Rw is extended astride the border between the region CHR1 and the region CHR2.

The wiring substrate includes a conductor plane (conductor pattern) 2PL as a large-area conductor pattern in each of the wiring layers. A specific description will be given. In the wiring layer WL1 shown in FIG. 9, the conductor plane (conductor pattern) 2PL1 supplied with reference potential VSS (Refer to FIG. 2) is formed. The conductor plane 2PL1 covers most of the region CHR2 in the wiring layer WL1. The conductor plane 2PL1 is also located in the region CHR1. The conductor plane 2PL1 is placed between signal pads Ty, between signal pads Ry, and between power supply potential pads Vdy in the region CHR1. In the region CHR1 of the wiring layer WL1, apart of the conductor plane 2PL1 functions as a reference potential pad Vsy. The conductor plane 2PL1 is not placed between a signal pad Tyn and a signal pad Typ configuring a differential pair or between a signal pad Ryn and a signal pad Ryp configuring a differential pair.

In the wiring layer WL2 shown in FIG. 11, the conductor plane (conductor pattern) 2PL2 electrically coupled with the conductor plane 2PL1 (Refer to FIG. 9) is formed. The conductor plane 2PL2 is electrically coupled with the conductor plane 2PL1 through vias 2vs1. For this reason, the conductor plane 2PL2 is supplied with reference potential VSS (Refer to FIG. 2). The conductor plane 2PL2 is located both in the region CHR1 and in the region CHR2 in the wiring layer WL2. In the region CHR2, the conductor plane 2PL2 is placed between signal wirings Tw adjoining to each other. Specifically, the conductor plane 2PL2 is placed between adjoining differential pairs. The conductor plane 2PL2 is not placed between a signal wiring Twn and a signal wiring Twp configuring a differential pair. In the region CHR1, the conductor plane 2PL2 is placed between conductor patterns 2PVD supplied with power supply potential and conductor patterns 2PR transmitting input signals.

In the wiring layer WL3 shown in FIG. 12, the conductor plane (conductor pattern) 2PL3 electrically coupled with the conductor plane 2PL2 (Refer to FIG. 11) is formed. The conductor plane 2PL3 is electrically coupled with the conductor plane 2PL2 through vias 2vs2. For this reason, the conductor plane 2PL3 is supplied with reference potential VSS (Refer to FIG. 2). The conductor plane 2PL3 is located both in the region CHR1 and in the region CHR2 in the wiring layer WL3. In the region CHR2, the conductor plane 2PL3 covers most of the region CHR2. In the region CHR1, the conductor plane 2PL3 is placed between conductor patterns 2PVD supplied with power supply potential and conductor patterns 2PR transmitting input signals.

In the wiring layer WL4 shown in FIG. 13, the conductor plane (conductor pattern) 2PL4 electrically coupled with the conductor plane 2PL3 (Refer to FIG. 12) is formed. The conductor plane 2PL4 is electrically coupled with the conductor plane 2PL3 through vias 2vs3. For this reason, the conductor plane 2PL4 is supplied with reference potential VSS (Refer to FIG. 2). The conductor plane 2PL4 is located both in the region CHR1 and in the region CHR2 in the wiring layer WL4. In the region CHR2, the conductor plane 2PL4 is placed between signal wirings Rw adjoining to each other. Specifically, the conductor plane 2PL4 is placed between adjoining differential pairs. The conductor plane 2PL4 is not placed between a signal wiring Rwn and a signal wiring Rwp configuring a differential pair. In the region CHR1, the conductor plane 2PL4 is placed between conductor patterns 2PVD supplied with power supply potential and adjoining differential pairs (signal wirings Rw).

In the wiring layer WL5 shown in FIG. 14, the conductor plane (conductor pattern) 2PL5 electrically coupled with the conductor plane 2PL4 (Refer to FIG. 13) is formed. The conductor plane 2PL5 is electrically coupled with the conductor plane 2PL4 through vias 2vs4. For this reason, the conductor plane 2PL5 is supplied with reference potential VSS (Refer to FIG. 2). The conductor plane 2PL5 is located both in the region CHR1 and in the region CHR2 in the wiring layer WL5. The conductor plane 2PL5 is formed astride the border between the region CHR1 and the region CHR2 and covers most of the region CHR2. In the region CHR1, the conductor plane (conductor pattern) 2PLVD as a large-area conductor pattern supplied with power supply potential VDD (Refer to FIG. 2) is formed. The conductor plane 2PLVD overlaps with the conductor pattern 2PVD shown in FIG. 13 and does not overlap with signal wirings Rw. Each of signal wirings Rw overlaps with the conductor plane 2PL5 shown in FIG. 14.

As seen from a comparison of FIG. 11 and FIG. 13, as viewed in a plane (viewed from the side of the top surface 2t shown in FIG. 10), signal wirings Tw partly overlap with signal wirings Rw. In other words, as shown in FIG. 10, in a sectional view in a Z direction intersecting with (in FIG. 10, orthogonal to) the top surface 2t of the wiring substrate SUB1, signal wirings Tw partly overlap with signal wirings Rw. In the example shown in FIG. 11 and FIG. 13, each of signal wirings Tw (Refer to FIG. 11) and each of signal wirings Rw (Refer to FIG. 13) overlap with each other and are extended in an identical direction (X direction in FIG. 11 and FIG. 13). In other words, the signal wirings Tw and the signal wirings Rw run parallel as are overlapped with each other. As viewed in a plane, each of the conductor plane 2PL1, the conductor plane 2PL3, and the conductor plane 2PL5 overlaps with signal wirings Tw and signal wirings Rw. As viewed in a plane, each of the conductor plane 2PL1, the conductor plane 2PL3, and the conductor plane 2PL5 overlaps with the conductor plane 2PL2 shown in FIG. 11 and the conductor plane 2PL4 shown in FIG. 13.

According to the present embodiment, a signal wiring Tw and a signal wiring Rw are disposed in different wiring layers and the conductor plane 2PL3 is placed between a signal wiring Tw and a signal wiring Rw. For this reason, crosstalk noise can be reduced between a transmission path for input signals and a transmission path for output signals. Of crosstalk noise between signal transmission paths, crosstalk noise from a transmission path for output signals to a transmission path for input signals has a considerably significant influence as compared with other modes. According to the present embodiment, however, especially influential crosstalk noise is reduced by a shield effect of the conductor plane 2PL3.

If a signal wiring Tw and a signal wiring Rw are disposed in an identical wiring layer, it would be necessary to increase a clearance between the signal wiring Tw and the signal wiring Rw as a measure against crosstalk noise mentioned above. In the case of the present embodiment, a signal wiring Tw and a signal wiring Rw are disposed in different wiring layers; therefore, an arrangement interval of signal wirings Tw and signal wirings Rw can be reduced. As a result, it is possible to increase a number of signal transmission paths per unit area.

In the region CHR1 overlapping with the semiconductor chip CHP1 and a region in proximity thereto, a large number of signal transmission paths are densely placed. For this reason, an influence of crosstalk noise between signal transmission paths is considerably significant in the region CHR1 and the peripheral region thereof. In the case of the semiconductor device PKG1, as shown in FIG. 10, in the region CHR1 overlapping with the semiconductor chip CHP1 and in proximity to the region CHR1, the conductor plane 2PL3 is placed between a signal wiring Tw and a signal wiring Rw. In other words, the semiconductor device PKG1 is so structured that in the region CHR1 overlapping with the semiconductor chip CHP1, an electromagnetic influence of noise produced from a signal wiring Tw is blocked and prevented from propagating to a signal wiring Rw. For this reason, in a region where an influence of crosstalk noise is considerably significant, the influence of noise can be reduced. Conversely, in the case of the semiconductor device PKG1, an influence of noise can be reduced in the region CHR1 and the vicinity thereof and thus a large number of signal transmission paths can be integrated.

In the case of the present embodiment, as shown in FIG. 10, a transmission path (signal wiring Tw) for output signals is drawn from the region CHR1 to the region CHR2 in the wiring layer WL2; and a transmission path (signal wiring Rw) for input signals is drawn from the region CHR1 to the region CHR2 in the wiring layer WL4. As shown in FIG. 8, each of transmission paths (signal electrodes Tx) for output signals is placed in the row PDL1 close to the outer edge of the front surface 3t in the front surface 3t of the semiconductor chip CHP1; and each of transmission paths (signal electrodes Rx) for input signals is placed in the row PDL3 closer to the center of the front surface 3t than the row PDL1 is in the front surface 3t of the semiconductor chip CHP1. In this case, as shown in FIG. 10, in the interior of the wiring substrate SUB1, it is possible to suppress a transmission path for output signals and a transmission path for input signals from intersecting with each other. As a result, it is possible to simplify a layout of wirings in the wiring substrate SUB1 and reduce crosstalk noise between output signals and input signals.

As mentioned above, each of the signal SGT and the signal SGR shown in FIG. 1 is a differential signal. For this reason, the signal electrodes Tx shown in FIG. 8 include a signal electrode Txp and a signal electrode Txn from which a pair of differential signals are outputted. As shown in FIG. 11, the signal wirings Tw include a signal wiring Twp and a signal wiring Twn from which a pair of differential signals are outputted. Similarly, the signal electrodes Rx shown in FIG. 8 include a signal electrode Rxp and a signal electrode Rxn to which a pair of differential signals are inputted. As shown in FIG. 13, the signal wirings Rw include a signal wiring Rwp and a signal wiring Rwn to which a pair of differential signals are inputted. In other words, the signal electrodes Tx shown in FIG. 8 and the signal wirings Tw shown in FIG. 11 include a first differential pair and the signal electrodes Rx shown in FIG. 8 and the signal wirings Rw shown in FIG. 13 include a second differential pair.

As shown in FIG. 11, as viewed in a plane, the conductor plane 2PL2 is not located between two wirings (signal wiring Twp and signal wiring Twn) configuring the first differential pair among signal wirings Tw and the two wirings configuring the first differential pair are placed adjacently to each other. Similarly, as shown in FIG. 13, as viewed in a plane, the conductor plane 2PL4 is not located between two wirings (signal wiring Rwp and signal wiring Rwn) configuring the second differential pair among signal wirings Rw and the two wirings configuring the second differential pair are placed adjacently to each other.

As shown in FIG. 11 and FIG. 13, the conductor plane 2PL is placed between individual differential pairs. In other words, in the plan view shown in FIG. 11, the conductor plane 2PL2 is located between adjoining first differential pairs of the first differential pairs of signal wirings Tw. In the plan view shown in FIG. 13, the conductor plane 2PL4 is located between adjoining second differential pairs of the second differential pairs of signal wirings Rw. In this case, as shown in FIG. 15, the periphery of each of the first differential pairs of signal wirings Tw and the second differential pairs of signal wirings Rw is shielded by the conductor plane 2PL. For this reason, crosstalk noise can be reduced between adjoining differential pairs.

As shown in FIG. 11, as viewed in a plane, vias 2vs1 (and vias 2vs2) electrically coupling the conductor plane 2PL1 (Refer to FIG. 9) and the conductor plane 2PL2 with each other are placed neighboring the first differential pairs of signal wirings Tw from both sides in a direction in which the first differential pairs are extended. As shown in FIG. 13, as viewed in a plane, vias 2vs3 (and vias 2vs4) electrically coupling the conductor plane 2PL3 (Refer to FIG. 12) and the conductor plane 2PL4 with each other are placed neighboring the second differential pairs of signal wirings Rw from both sides in a direction in which the second differential pairs are extended. In cases where a plurality of vias are arranged adjacently to a differential pair on both sides in a direction in which wirings are extended as mentioned above, the vias function as a shield against noise. As a result, crosstalk noise can be reduced between adjoining differential pairs.

As shown in FIG. 11, vias 2vs1 electrically coupling the conductor plane 2PL1 (Refer to FIG. 9) and the conductor plane 2PL2 with each other are placed in the conductor plane 2PL2 located between adjoining first differential pairs in a direction in which the conductor plane 2PL2 is extended. Vias 2vs3 electrically coupling the conductor plane 2PL3 (Refer to FIG. 12) and the conductor plane 2PL4 with each other are placed in the conductor plane 2PL4 located between adjoining second differential pairs in a direction in which the conductor plane 2PL4 is extended. The vias 2vs1 and the vias 2vs3 are respectively provided with a narrow pitch. In the case shown in FIG. 11, for example, the arrangement interval of the vias 2vs1 placed between adjoining first differential pairs is substantially equal to the arrangement interval of the adjoining first differential pairs (signal electrode Txp and signal electrode Txn) and is not more than 2 times the arrangement interval of the first differential pairs (signal electrode Txp and signal electrode Txn). In the example shown in FIG. 13, the arrangement interval of the vias 2vs3 placed between adjoining second differential pairs is substantially equal to the arrangement interval of the adjoining second differential pairs (signal electrode Rxp and signal electrode Rxn) and is not more than 2 times the arrangement interval of the second differential pairs (signal electrode Rxp and signal electrode Rxn).

By coupling a large number of vias 2vs1, 2vs3 to a conductor pattern for blocking electromagnetic waves produced from a signal transmission path with a narrow pitch as mentioned above, potential of the conductor pattern is stabilized and a shielding property can be enhanced.

As seen from a comparison of FIG. 11 and FIG. 13, the conductor plane 2PL2 (Refer to FIG. 11) located between adjoining first differential pairs and the conductor plane 2PL4 located between adjoining second differential pairs are extended in an identical direction (X direction) as viewed in a plane and overlap with each other as viewed in a plane as shown in FIG. 15.

As shown in FIG. 17, each of signal wirings Rw includes the end RwE1 (Refer to FIG. 13), the end RwE2 opposite the RwE1, and a wiring portion electrically coupling the end RwE1 and the end RwE2 with each other. As shown in FIG. 13, the wiring portion of each signal wiring Rw includes a wiring section RwW1 extended with a first line width and a wiring section RwW2 extended with a second line width wider than the first line width. As viewed in a plane, the wiring section RwW2 is located on the peripheral side of the wiring substrate SUB1 as compared with the wiring section RwW1.

As shown in FIG. 13, each of signal wirings Rw is placed between conductor patterns 2PVD supplied with power supply potential. In this case, it is desirable to provide a conductor pattern functioning as a shield between a conductor pattern 2PVD and a signal wiring Rw to reduce an influence of noise from the conductor pattern 2PVD. In the region CHR1, however, a large number of transmission paths are densely placed and thus it is difficult to ensure a space sufficient to provide a shielding conductor pattern between a conductor pattern 2PVD and a signal wiring Rw. Consequently, in the present embodiment, the line width of each wiring section RwW1 located in the region CHR1 is narrower than the line width of each wiring section RwW2 located in the region CHR2. As a result, it is possible to provide a conductor pattern functioning as a shield between a conductor pattern 2PVD and a signal wiring Rw.

In other words, the wiring layer WL4 shown in FIG. 13 includes vias (power supply potential vias) 2vd3, 2vd4 electrically coupled with power supply potential electrodes Vd (Refer to FIG. 8) and placed in the region CHR1 as viewed in a plane. As viewed in a plane, the vias 2vd3, 2vd4 are placed between the wiring sections RwW1 of adjoining wiring portions of signal wirings Rw. As viewed in a plane, the vias 2vd3, 2vd4 are surrounded with the conductor plane 2PL4 provided separately from the vias 2vd3, 2vd4. In the example shown in FIG. 13, in the region CHR1 of the wiring layer WL4, the ends RwE1 of signal wirings Rw and the wiring sections RwW1 of wiring portions are located but the wiring sections RwW2 of the wiring portions are not located. However, the wiring section RwW2 of a wiring portion may be located in the region CHR1 as long as a space for disposing the wiring section RwW2 of a wiring portion can be ensured in the region CHR1.

The wiring layer WL2 shown in FIG. 11 includes vias (power supply potential vias) 2vd1, 2vd2 electrically coupled with power supply potential electrodes Vd (Refer to FIG. 8) and placed in the region CHR1 as viewed in a plane. Each of signal wirings Tw includes the end TwE1, the end TwE2 (Refer to FIG. 16) opposite the TwE1, and a wiring portion electrically coupling the end TwE1 and the end TwE2 with each other. As viewed in a plane, the end TwE1 of each of signal wirings Tw is located in the region CHR1 of the wiring layer WL2 and the vias 2vd1, 2vd2 are not located between individual signal wirings Tw. In the case of the signal wiring Tw, a conductor pattern supplied with power supply potential is not located between signal wirings Tw as mentioned above; therefore, a part of each signal wiring Tw is not reduced in line width. That is, the wiring portion of each signal wiring Rw shown in FIG. 13 includes a wiring section RwW1 and a wiring section RwW2 different in line width while the wiring portion of each signal wiring Tw shown in FIG. 11 has a constant line width. "Constant line width" cited above also includes cases where there is a slight error depending on the position of a wiring portion as long as the error can be considered to be substantially constant within an error range required for the relevant signal transmission path.

As seen from a comparison of FIG. 11 and FIG. 13, the line width of the wiring portion of each of signal wirings Tw in the region CHR1 of the wiring layer WL2 is wider than the line width of the wiring section RwW1 of the wiring portion of each of signal wirings Rw in the wiring layer WL4.

As shown in FIG. 16 and FIG. 17, the wiring substrate SUB1 has around the region CHR1 overlapping with the semiconductor chip CHP1 (Refer to FIG. 6) a region WR1 in which a signal wiring Tw and a signal wiring Rw run parallel as are overlapped with each other and a region WR2 where a signal wiring Tw and a signal wiring Rw do not overlap with each other. In the X direction, the region WR1 is located between the region CHR1 and the region WR2. In other words, each of the wiring layers of the wiring substrate SUB1 includes: the region CHR1 overlapping with the semiconductor chip CHP1 as viewed in a plane; the region WR2 located closer to the edge side of the wiring substrate SUB1 than the region CHR1 is; and the region WR1 located between the region CHR1 and the region WR2. As viewed in a plane, each of signal wirings Tw and each of signal wirings Rw overlap with each other in the region WR1 and do not overlap with each other in the region WR2.

As viewed in a plane, in the region CHR1 overlapping with the semiconductor chip CHP1 (Refer to FIG. 6) and the region WR1 located in proximity thereto, a large number of signal transmission paths are densely placed. For this reason, the packing density of signal transmission paths can be increased by arranging signal wirings Tw and signal wirings Rw such that the wirings overlap with each other.

Meanwhile, the region WR2 as a peripheral region of the wiring substrate SUB1 has a sufficient space as compared with the region WR1; therefore, a layout in which a signal wiring Tw and a signal wiring Rw do not overlap with each other can be applicable. In the region WR2, through hole wirings 2THW and vias 2v electrically coupling each of signal transmission paths and lands 2LD as external input/output terminals of the semiconductor device PKG1 shown in FIG. 6 with each other are placed. For this reason, from the point of view of reduction of crosstalk noise between a transmission path for output signals and a transmission path for input signals, it is desirable to ensure a large clearance between the through hole wirings 2THW and the vias 2v for output signals and the through hole wirings 2THW and the vias 2v for input signals in the region WR2.

Each of the capacitors CDC shown in FIG. 5 is mounted above the region WR2 shown in FIG. 16 and FIG. 17 over the top surface 2t of the wiring substrate SUB1. The capacitors CDC are respectively electrically coupled to the signal wirings Rw shown in FIG. 17. In cases where a capacitor CDC is placed in proximity to an electrode for transmitting signals of a semiconductor chip, the impedance of a part of a signal transmission path may be brought out of a design value due to an influence of the capacitor CDC. For this reason, it is preferable to ensure a large clearance between the semiconductor chip CHP1 and a capacitor CDC from the point of view of matching the impedance of each signal transmission path. In the case of the present embodiment, each of capacitors CDC is mounted above the region WR2 shown in FIG. 17 as mentioned above. The region WR2 is located in a position closer to a side surface 2s of the wiring substrate SUB1 than the region CHR1 or the region WR1 is. Therefore, a clearance between the semiconductor chip CHP1 and a capacitor CDC can be increased and thus it is easy to match the impedance of each signal transmission path.

As seen from a comparison of FIG. 5 and FIG. 16, each of signal wirings Tw is not extended to a region where the wiring overlaps with capacitors CDC and is terminated between a region where the wiring overlaps with capacitors CDC and the region WR1. Therefore, each of signal wirings Tw does not overlap with each of capacitors CDC as viewed in a plane.

As shown in FIG. 16, a part of each of signal wirings Tw is placed in the region WR2 where the part does not overlap with a signal wiring Rw. Specifically, ends TwE2 of signal wirings Tw and the wiring portions in the periphery thereof are placed in the region WR2. In other words, each of signal wirings Tw includes a portion (end TwE2 and wiring portion in the periphery thereof) placed in the region WR2 of the wiring layer WL2. Each of the ends RwE2 of signal wirings Rw is electrically coupled with a capacitor CDC by way of the wiring layer WL3, the wiring layer WL2, and the wiring layer WL1 shown in FIG. 6. In cases where the end TwE2 of a signal wiring Tw is placed in a position where the end does not overlap with a signal wiring Rw as shown in FIG. 16, a sufficient clearance can be ensured between a transmission path for input signals and a transmission path for output signals in the wiring layer WL2.

The description of the above embodiment also refers to some modifications but hereafter, a description will be given to other representative modifications than the modifications described in relation to the above embodiment.

Modification 1

Figure 18:
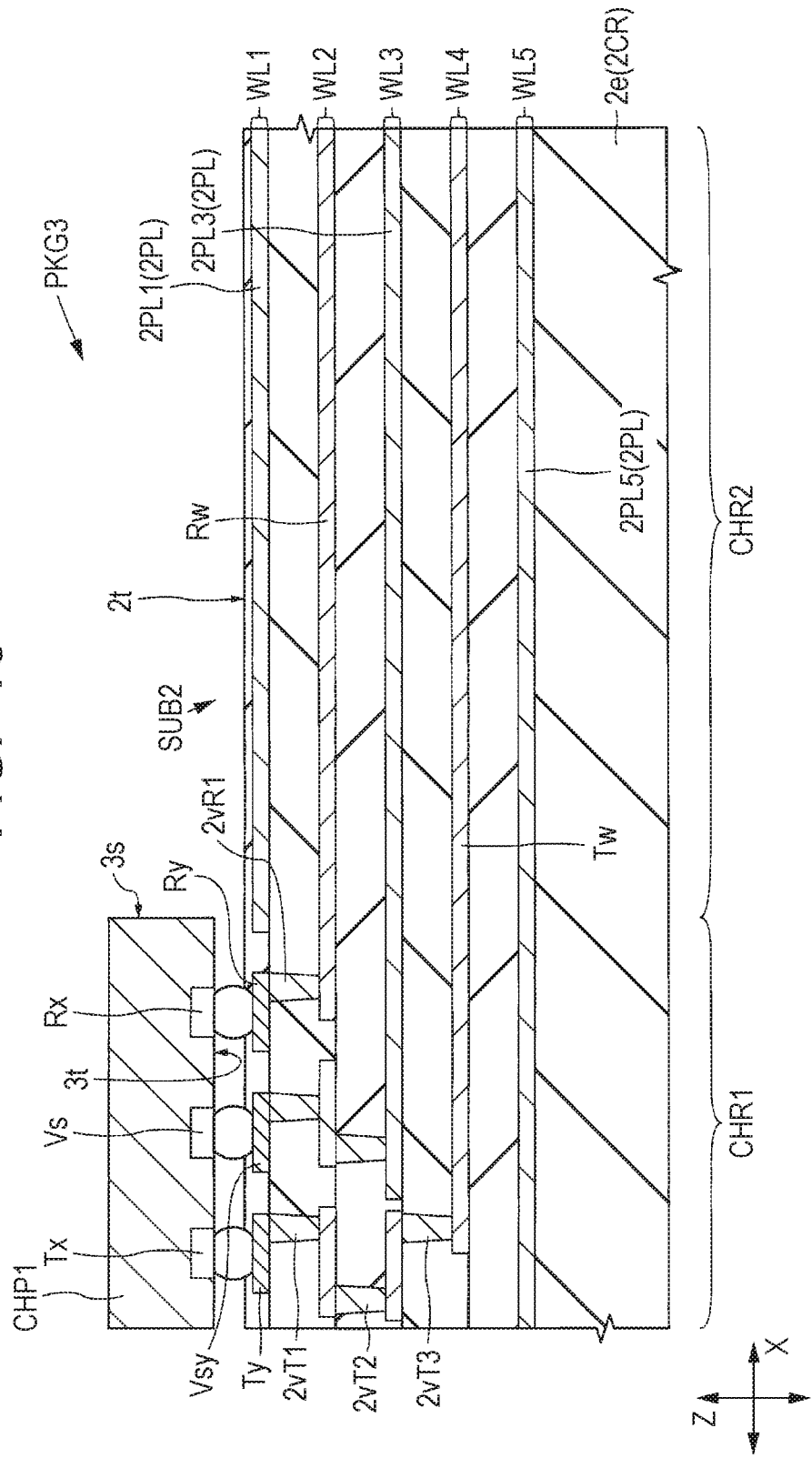
FIG. 18 is an enlarged sectional view illustrating a modification to FIG. 10.

An example will be taken. In relation to the semiconductor device PKG1 shown in FIG. 10, a description was given to a mode in which signal wirings Tw are arranged in the wiring layer WL2 and signal wirings Rw are arranged in the wiring layer WL4. As a modification, signal wirings Tw may be arranged in the wiring layer WL4 and signal wirings Rw may be arranged in the wiring layer WL2 as in the wiring substrate SUB2 of the semiconductor device PKG3 shown in FIG. 18. FIG. 18 is an enlarged sectional view illustrating a modification to FIG. 10. Though a planar layout of signal wirings Tw and signal wirings Rw provided in the semiconductor device PKG3 is not shown in a drawing, the layout can be described with reference to FIG. 16 and FIG. 17. A more specific description will be given. The plan view shown in FIG. 16 can be considered as that of the wiring layer WL4 of the wiring substrate SUB2. The plan view shown in FIG. 17 can be considered as that of the wiring layer WL2 of the wiring substrate SUB2. In the case of the semiconductor device PKG3, signal wirings Rw are placed in the wiring layer WL2 closer to the top surface 2t than the wiring layer WL4 is. For this reason, the passage distance between the end RwE2 (Refer to FIG. 17) of a signal wiring Rw and a capacitor CDC (Refer to FIG. 5) is shorter as compared with the case of the wiring substrate SUB1 of the semiconductor device PKG1 shown in FIG. 10. In the case of the semiconductor device PKG3, the transmission distance between a capacitor CDC and a signal electrode Rx is shorter as compared with the case of the wiring substrate SUB1 of the semiconductor device PKG1 shown in FIG. 10. A possibility that after a direct-current component is cut, noise enters a signal transmission path can be reduced by shortening the transmission distance between a capacitor CDC and an electrode Rx.

Modification 2

Figure 19:
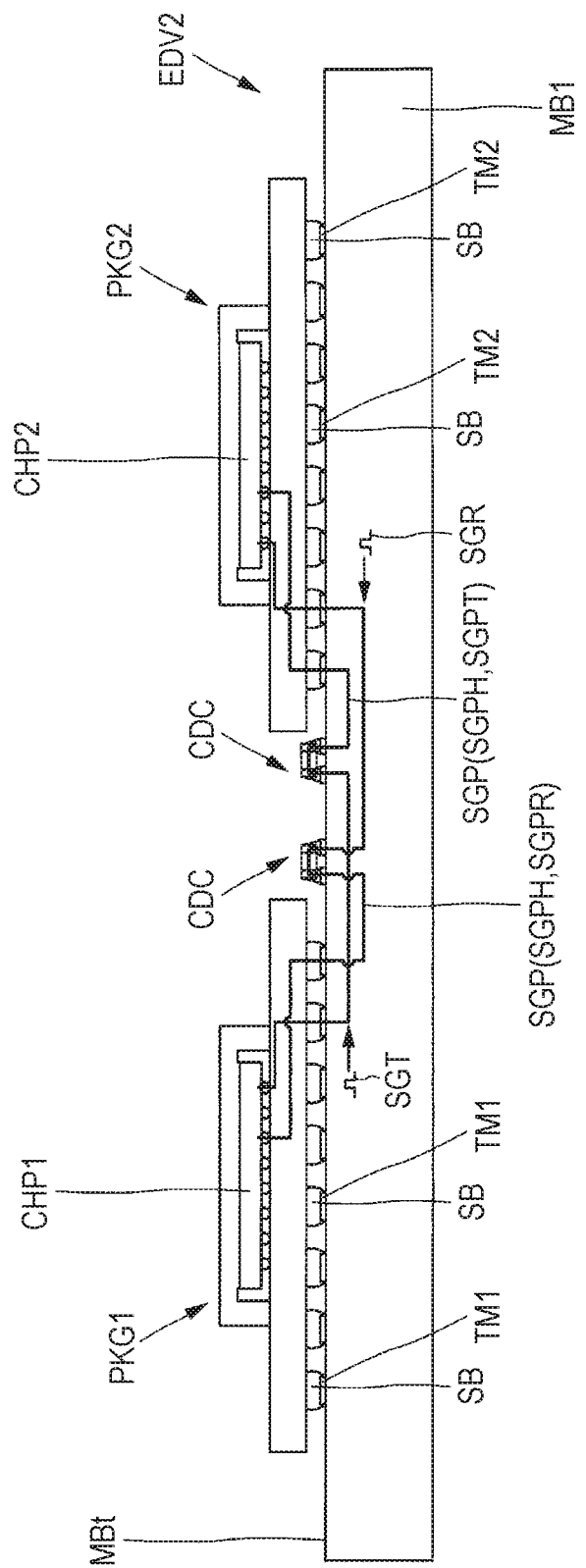
FIG. 19 is an explanatory drawing illustrating a modification to FIG. 1.

In relation to FIG. 6, a description was given to an embodiment in which a plurality of capacitors CDC and a plurality of capacitors CPS are mounted over the top surface 2*t* of a wiring substrate SUB1. As a modification, there is also a case where a capacitor CDC is not incorporated in a semiconductor device PKG1. In the electronic device EDV2 shown in FIG. 19, for example, a plurality of capacitors CDC are mounted over a circuit board MB1 and the capacitors CDC are coupled to signal transmission paths SGP. In this case, a semiconductor device PKG1 or a semiconductor device PKG2 need not be mounted with a capacitor CDC. FIG. 19 is an explanatory drawing illustrating a modification to FIG. 1. Though not shown in a drawing, as a modification to FIG. 6, there is also a case where a capacitor CPS is not incorporated into a wiring substrate SUB1.

Modification 3

Up to this point, a description was given to various modifications. Each modification described above can be combined for an application of the present invention.

Aside from the foregoing, a part of the contents described in relation to the above embodiments will be described below:

Appendant 1

A semiconductor device includes:

a semiconductor chip having a first front surface, a first back surface on the opposite side to the first front surface, and a plurality of electrodes arranged in a plurality of rows from the outermost periphery closest to the outer edge of the first front surface toward the center of the first front surface in the first front surface; and a wiring substrate having a first main surface over which the semiconductor chip is mounted, a second main surface on the opposite side to the first main surface, and a plurality of wiring layers located between the first main surface and the second main surface.

The electrodes of the semiconductor chip include a plurality of first signal electrodes for transmitting first signals as one of input signals and output signals, a plurality of second signal electrodes for transmitting second signals as the other of input signals and output signals, a plurality of first potential electrode supplied with first potential, and a plurality of second potential electrodes supplied with second potential different from the first potential.

In the first front surface of the semiconductor chip, the first signal electrodes are arranged in a first row between the outer edge of the first front surface and the center of the first front surface, the first potential electrodes and the second potential electrodes are arranged in a second row between the first row and the center of the first front surface, and the second signal electrodes are arranged in a third row between the second row and the center of the first front surface.

The wiring layers of the wiring substrate include a first wiring layer located between the first main surface and the second main surface, a second wiring layer located between the first wiring layer and the second main surface, a third wiring layer located between the second wiring layer and the second main surface, a fourth wiring layer located between the third wiring layer and the second main surface, and a fifth wiring layer located between the fourth wiring layer and the second main surface.

The wiring substrate includes:

a plurality of first signal wirings formed in the second wiring layer and respectively coupled to the first signal electrodes;

a plurality of second signal wirings formed in the fourth wiring layer and respectively coupled to the second signal electrodes;

a first conductor pattern formed in the first wiring layer and supplied with the second potential;

a second conductor pattern formed in the second wiring layer and electrically coupled with the first conductor pattern;

a third conductor pattern formed in the third wiring layer and electrically coupled with the second conductor pattern;

a fourth conductor pattern formed in the fourth wiring layer and electrically coupled with the third conductor pattern; and a fifth conductor pattern formed in the fifth wiring layer and electrically coupled with the fourth conductor pattern.

As viewed in a plane, each of the first signal wirings is sandwiched between the first conductor pattern and the third conductor pattern.

As viewed in a plane, each of the second signal wirings is sandwiched between the third conductor pattern and the fifth conductor pattern.

Each of the wiring layers of the wiring substrate includes a first region overlapping with the semiconductor chip as viewed in a plane, a third region located on the side of the periphery of the wiring substrate as compared with the first region as viewed in a plane, and a second region located between the first region and the third region.

As viewed in a plane, each of the first signal wirings and each of the second signal wirings overlap with each other in the second region and do not overlap with each other in the third region.

Up to this point, a concrete description has been given to the invention made by the present inventors based on embodiments. However, the present invention is not limited to the above-mentioned embodiments and can be variously modified without departing from the subject matter thereof, needless to add.

What is claimed is:

1. A semiconductor device comprising:

a semiconductor chip including a first front surface, a first back surface on the opposite side to the first front surface, and, in the first front surface, a plurality of electrodes arranged in a plurality of rows from the outermost periphery closest to the outer edge of the first front surface toward the center of the first front surface; and a wiring substrate including a first main surface over which the semiconductor chip is mounted, a second main surface on the opposite side to the first main surface, and a plurality of wiring layers located between the first main surface and the second main surface, wherein the electrodes of the semiconductor chip include a plurality of first signal electrodes for transmitting a first signal as one of an input signal and an output signal, a plurality of second signal electrodes for transmitting a second signal as the other of an input signal and an output signal, a plurality of first potential electrodes supplied with first potential, and a plurality of second potential electrodes supplied with second potential different from the first potential, wherein in the first front surface of the semiconductor chip, the first signal electrodes are arranged in a first row between the outer edge of the first front surface and the center of the first front surface, the first potential electrodes and the second potential electrodes are arranged in a second row between the first row and the center of the first front surface, and the second signal electrodes are arranged in a third row between the second row and the center of the first front surface, wherein the wiring layers of the wiring substrate include a first wiring layer located between the first main surface and the second main surface, a second wiring layer located between the first wiring layer and the second main surface, a third wiring layer located between the second wiring layer and the second main surface, a fourth wiring layer located between the third wiring layer and the second main surface, and a fifth wiring layer located between the fourth wiring layer and the second main surface, wherein the wiring substrate includes:

a plurality of first signal wirings formed in the second wiring layer and respectively coupled to the first signal electrodes;

a plurality of second signal wirings formed in the fourth wiring layer and respectively coupled to the second signal electrodes;

a first conductor pattern formed in the first wiring layer and supplied with the second potential;

a second conductor pattern formed in the second wiring layer and electrically coupled with the first conductor pattern;

a third conductor pattern formed in the third wiring layer and electrically coupled with the second conductor pattern;

a fourth conductor pattern formed in the fourth wiring layer and electrically coupled with the third conductor pattern; and a fifth conductor pattern formed in the fifth wiring layer and electrically coupled with the fourth conductor pattern, wherein as viewed in a plane, a part of each of the first signal wirings overlaps with a part of each of the second signal wirings, and wherein as viewed in a plane, each of the first conductor pattern, the third conductor pattern, and the fifth conductor pattern overlaps with the second conductor pattern, the fourth conductor pattern, the first signal wirings, and the second signal wirings.

2. The semiconductor device according to claim 1, wherein each of the first signal and the second signal is a differential signal, wherein the first signal electrodes and the first signal wirings include a first differential pair, wherein the second signal electrodes and the second signal wirings include a second differential pair, wherein, among the first signal wirings, as viewed in a plane, the second conductor pattern is not located between two wirings configuring the first differential pair and two wirings configuring the first differential pair are placed adjacently to each other, and wherein, among the second signal wirings, as viewed in a plane, the fourth conductor pattern is not located between two wirings configuring the second differential pair and two wirings configuring the second differential pair are placed adjacently to each other.

3. The semiconductor device according to claim 2, wherein the first signal electrodes and the first signal wirings include a plurality of the first differential pairs, wherein the second signal electrodes and the second signal wirings include a plurality of the second differential pairs, wherein as viewed in a plane, the second conductor pattern is located between the first differential pairs adjoining to each other among the first differential pairs of the first signal wirings, and wherein as viewed in a plane, the fourth conductor pattern is located between the second differential pairs adjoining to each other among the second differential pairs of the second signal wirings.

4. The semiconductor device according to claim 2, wherein as viewed in a plane, a plurality of first vias electrically coupling the first conductor pattern and the second conductor pattern with each other are placed on both sides of the first differential pair of the first signal wirings on both sides in a direction in which the first differential pair is extended, and wherein as viewed in a plane, a plurality of second vias electrically coupling the third conductor pattern and the fourth conductor pattern with each other are placed on both sides of the second differential pair of the second signal wirings in a direction in which the second differential pair is extended.

5. The semiconductor device according to claim 2, wherein the first signal electrodes and the first signal wirings include a plurality of the first differential pairs, wherein the second signal electrodes and the second signal wirings include a plurality of the second differential pairs, wherein as viewed in a plane, the second conductor pattern is located between the first differential pairs adjoining to each other among the first differential pairs of the first signal wirings, wherein as viewed in a plane, the fourth conductor pattern is located between the second differential pairs adjoining to each other among the second differential pairs of the second signal wirings, and wherein the second conductor pattern located between the first differential pairs adjoining to each other and the fourth conductor pattern located between the second differential pairs adjoining to each other are extended in an identical direction and overlapped with each other as viewed in a plane.

6. The semiconductor device according to claim 5, wherein in the second conductor pattern located between the first differential pairs adjoining to each other, a plurality of first vias electrically coupling the first conductor pattern and the second conductor pattern with each other are placed in a direction in which the second conductor pattern is extended, and wherein in the fourth conductor pattern located between the second differential pairs adjoining to each other, a plurality of second vias electrically coupling the third conductor pattern and the fourth conductor pattern with each other are placed in a direction in which the fourth conductor pattern is extended.

7. The semiconductor device according to claim 1, wherein each of the second signal wirings includes a first end, a second end on the opposite side to the first end, and a wiring portion electrically coupling the first end and the second end with each other, wherein the wiring portion includes a first wiring section extended with a first line width and a second wiring section extended with a second line width wider than the first line width, and wherein as viewed in a plane, the second wiring section is located on the peripheral side of the wiring substrate as compared with the first wiring section.

8. The semiconductor device according to claim 7, wherein each of the wiring layers of the wiring substrate includes a first region overlapping with the semiconductor chip as viewed in a plane and a second region located on the side of the periphery of the wiring substrate as compared with the first region as viewed in a plane, and wherein in the first region of the fourth wiring layer, the first ends of the second signal wirings and the first wiring section of the wiring portion are located and the second wiring section of the wiring portion is not located.

9. The semiconductor device according to claim 8, wherein the second signal is a differential signal, wherein the second signal electrodes and the second signal wirings include a plurality of second differential pairs, wherein, among the second signal wirings, as viewed in a plane, the fourth conductor pattern is not located between two wirings configuring each of the second differential pairs and two wirings configuring the second differential pair are placed adjacently to each other, and wherein as viewed in a plane, the fourth conductor pattern is located between the second differential pairs adjoining to each other among the second differential pairs of the second signal wirings.

10. The semiconductor device according to claim 9, wherein the fourth wiring layer is electrically coupled with the first potential electrodes and includes a first potential via placed in the first region as viewed in a plane, wherein as viewed in a plane, the first potential via is placed between the first wiring sections of the wiring portions adjoining to each other among the second signal wirings, and wherein as viewed in a plane, the first potential via is surrounded with the fourth conductor pattern placed separately from the first potential via.

11. The semiconductor device according to claim 10, wherein the second wiring layer is electrically coupled with the first potential electrodes and includes the first potential via placed in the first region as viewed in a plane, wherein each of the first signal wirings includes a third end, a fourth end on the opposite side to the third end, and a wiring portion electrically coupling the third end and the fourth end with each other, and wherein as viewed in a plane, the third end of each of the first signal wirings is located in the first region of the second wiring layer and the first potential via is not located between the first signal wirings.

12. The semiconductor device according to claim 11, wherein a line width of the wiring portion of each of the first signal wirings in the first region of the second wiring layer is wider than a first line width of the first wiring section of the wiring portion of each of the second signal wirings in the fourth wiring layer.

13. The semiconductor device according to claim 1, wherein each of the wiring layers of the wiring substrate includes a first region overlapping with the semiconductor chip as viewed in a plane, a third region located on the side of the periphery of the wiring substrate as compared with the first region as viewed in a plane, and a second region located between the first region and the third region, and wherein as viewed in a plane, each of the first signal wirings and each of the second signal wirings overlap with each other in the second region and do not overlap with each other in the third region.

14. The semiconductor device according to claim 13, wherein as viewed in a plane, a plurality of capacitors are mounted above the third region over the first main surface of the wiring substrate, and wherein each of the capacitors is electrically coupled with the second signal wirings.

15. The semiconductor device according to claim 14, wherein each of the first signal wirings does not overlap with each of the capacitors as viewed in a plane.

16. The semiconductor device according to claim 15, wherein each of the first signal wirings includes a portion placed in the third region of the second wiring layer.

17. The semiconductor device according to claim 1, wherein the first signal is an output signal outputted from the semiconductor chip and the second signal is an input signal inputted to the semiconductor chip.

18. The semiconductor device according to claim 1, wherein in the first front surface of the semiconductor chip, the first potential electrodes and the second potential electrodes are alternately arranged in a direction in which the second row is extended.

19. The semiconductor device according to claim 1, wherein the second potential is ground potential.

* * * * *